US012757688B2

(12) United States Patent
Kim

(10) Patent No.: US 12,757,688 B2
(45) Date of Patent: Oct. 6, 2026

(54) SEMICONDUCTOR DEVICE AND METHOD OF MANUFACTURING THE SAME

(71) Applicant: SK hynix Inc., Icheon-si (KR)

(72) Inventor: Jae Ho Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 728 days.

(21) Appl. No.: 17/974,205

(22) Filed: Oct. 26, 2022

(65) Prior Publication Data

US 2023/0369141 A1 Nov. 16, 2023

(30) Foreign Application Priority Data

May 16, 2022 (KR) ........................ 10-2022-0059307

(51) Int. Cl.

| | |
|---|---|
| ***H01L 23/00*** | (2006.01) |
| ***H10B 41/10*** | (2023.01) |
| ***H10B 41/27*** | (2023.01) |
| ***H10B 43/10*** | (2023.01) |
| ***H10B 43/27*** | (2023.01) |
| ***H10D 64/23*** | (2025.01) |
| ***H10P 74/00*** | (2026.01) |
| ***H10W 20/41*** | (2026.01) |
| ***H10W 20/42*** | (2026.01) |

(52) U.S. Cl.

CPC ........... *H10P 74/273* (2026.01); *H10B 41/10* (2023.02); *H10B 41/27* (2023.02); *H10B 43/10* (2023.02); *H10B 43/27* (2023.02); *H10D 64/258* (2025.01); *H10W 20/42* (2026.01); *H10W 20/435* (2026.01); *H10W 20/425* (2026.01)

(58) Field of Classification Search

CPC . H01L 21/78; H01L 22/34; H01L 2223/5446; H01L 23/562

See application file for complete search history.

(56) References Cited

U.S. PATENT DOCUMENTS

| | | | | |
|---|---|---|---|---|
| 11,075,181 | B2 * | 7/2021 | Han | H01L 22/34 |
| 2017/0148748 | A1 * | 5/2017 | Jeong | H01L 23/562 |
| 2018/0174933 | A1 | 6/2018 | Kim et al. | |
| 2018/0301374 | A1 * | 10/2018 | Masamori | H10B 43/40 |
| 2019/0035750 | A1 * | 1/2019 | Han | H01L 23/562 |
| 2019/0221535 | A1 * | 7/2019 | Shin | H10P 74/277 |
| 2020/0027783 | A1 * | 1/2020 | Kim | H10W 20/071 |
| 2021/0043648 | A1 * | 2/2021 | Kim | H10B 43/10 |
| 2021/0175133 | A1 * | 6/2021 | Choi | H01L 22/32 |
| 2023/0062595 | A1 * | 3/2023 | Kondo | H10B 43/27 |

(Continued)

FOREIGN PATENT DOCUMENTS

| | | |
|---|---|---|
| JP | 2019029654 A | 2/2019 |
| JP | 2020047727 A | 3/2020 |
| JP | 2020050233 A | 4/2020 |

(Continued)

*Primary Examiner* — Nicholas J Tobergte
*Assistant Examiner* — David J Goodwin
(74) *Attorney, Agent, or Firm* — WILLIAM PARK AND ASSOCIATES LTD.

(57) ABSTRACT

A method of manufacturing a semiconductor device includes forming a test circuit in a cross area of a scribe lane area disposed between chip areas of a substrate. The method also includes forming a first dummy structure on the test circuit, forming a test pad in a line area of the scribe lane area of the substrate, and cutting the substrate along the scribe lane area.

20 Claims, 18 Drawing Sheets

B-B'

(56) References Cited

U.S. PATENT DOCUMENTS

| | | | | |
|---|---|---|---|---|
| 2023/0187279 | A1* | 6/2023 | Ono | H01L 21/78 |

FOREIGN PATENT DOCUMENTS

| | | | |
|---|---|---|---|
| JP | 2021027333 | A | 2/2021 |
| JP | 2021150602 | A | 9/2021 |
| JP | 2021190536 | A | 12/2021 |
| KR | 1020180076841 | A | 7/2018 |
| KR | 1020190012307 | A | 2/2019 |
| KR | 1020190115754 | A | 10/2019 |
| KR | 1020200020500 | A | 2/2020 |
| KR | 1020210071307 | A | 6/2021 |

* cited by examiner

A-A'

B-B'

SEMICONDUCTOR DEVICE AND METHOD OF MANUFACTURING THE SAME

CROSS-REFERENCE TO RELATED APPLICATION

This application claims priority under 35 U.S.C. § 119(a) to Korean Patent Application No. 10-2022-0059307 filed on May 16, 2022, in the Korean Intellectual Property Office, which is incorporated herein by reference in its entirety.

BACKGROUND

1. Technical Field

Embodiments relate to an electronic device and a method of manufacturing the same and, more particularly, to a semiconductor device and a method of manufacturing the same.

2. Related Art

The degree of integration of semiconductor devices is basically determined by the area occupied by a unit memory cell. As the improvement of the degree of integration of semiconductor devices in which memory cells are formed on a substrate in the form of a single layer reaches its limit, there is proposed a three-dimensional (3-D) semiconductor device in which memory cells are stacked on a substrate. Furthermore, in order to improve operational reliability of such a semiconductor device, various structures and manufacturing methods are being developed.

SUMMARY

In accordance with the present disclosure, a method of manufacturing a semiconductor device may include forming a test circuit in a cross area of a scribe lane area disposed between chip areas of a substrate. The method may also include forming a first dummy structure on the test circuit, forming a test pad in a line area of the scribe lane area of the substrate, and cutting the substrate along the scribe lane area.

In accordance with an embodiment of the present disclosure, a semiconductor device may include a substrate including chip areas and a scribe lane area disposed between the chip areas. The semiconductor device may further include a test pad disposed in a line area of the scribe lane area, a test circuit disposed in a cross area of the scribe lane area, an interconnection structure that electrically connects the test pad and the test circuit, and a first dummy structure disposed in the cross area.

DETAILED DESCRIPTION

Hereinafter, embodiments according to the technical spirit of the present disclosure are described with reference to the accompanying drawings.

Embodiments of the present disclosure provide a semiconductor device having a stable structure and an improved characteristic and a method of manufacturing a semiconductor device.

According to the present technology, a semiconductor device having a stable structure and improved reliability can be provided.

Figure 1:
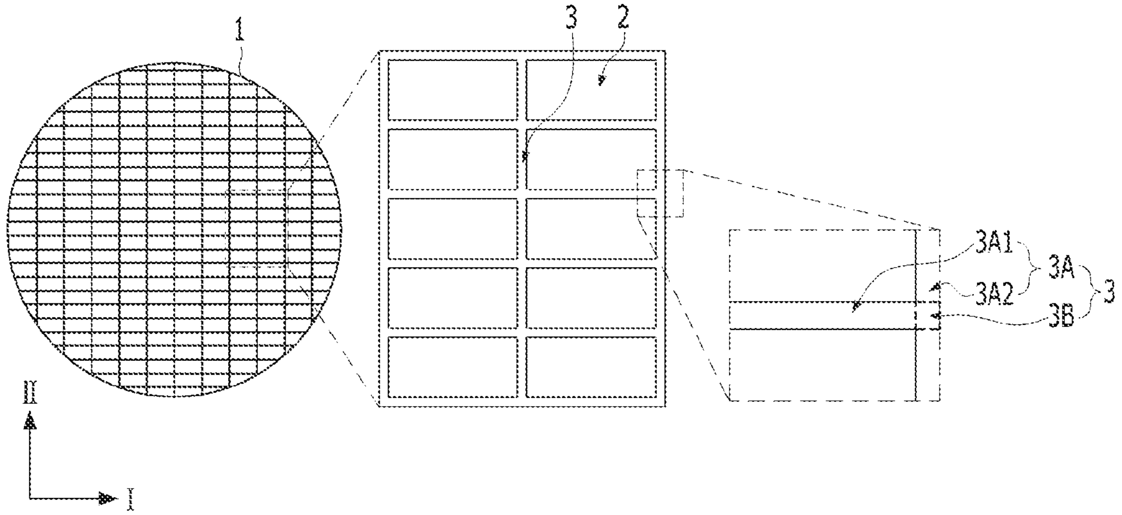
FIG. 1 is a diagram illustrating a structure of a semiconductor device according to an embodiment of the present disclosure.

FIG. 1 is a diagram illustrating a structure of a semiconductor device according to an embodiment of the present disclosure.

Referring to FIG. 1, the semiconductor device may include a substrate 1. The substrate 1 may include chip areas 2 and a scribe lane area 3. The substrate 1 may be a semiconductor substrate, such as a silicon wafer, a SiGe wafer, or an SOI wafer.

The chip areas 2 may be areas in which semiconductor chips are formed. The semiconductor chips may be repeatedly formed in the substrate 1. The chip areas 2 may be arranged in a first direction I and a second direction II that intersects the first direction I. Intersecting directions represent different directions. In some instances, for example, intersecting directions may represent orthogonal directions. The scribe lane area 3 may be disposed between the chip areas 2.

The scribe lane area 3 may include a line area 3A and a cross area 3B. The line area 3A may include a first area 3A1 that extends in the first direction I or a second area 3A2 that extends in the second direction II. The cross area 3B may be disposed in an area in which the line areas 3A are intersected. The cross area 3B may be disposed in an area in which the first area 3A1 and the second area 3A2 intersect.

A test structure for testing the semiconductor chips disposed in the chip areas 2 may be disposed in the scribe lane area 3. The test structure may include test circuits, test pads, an interconnection structure that electrically connects the test circuits and the test pads, etc. Furthermore, alignment patterns, such as an overlay key or an alignment key, may be disposed in the scribe lane area 3.

The scribe lane area 3 may be a portion that is cut out in a dicing process for separating the semiconductor chips. The chip areas 2 may be separated from each other by cutting the substrate 1 along the scribe lane area 3. The substrate 1 may be cut by using a method, such as a sawing process using a blade, a laser process using a laser, or a stealth dicing process. In a process of cutting the substrate 1, a dummy structure for protecting the chip areas 2 may be disposed in the scribe lane area 3.

According to the aforementioned structure, the test structure or the dummy structure may be disposed in the scribe lane area 3. The degree of integration of semiconductor chips can be improved by disposing the test structure in the scribe lane area 3, not the chip areas 2. The chip areas 2 can be protected when the substrate 1 is cut because the dummy structure is disposed in the scribe lane area 3.

Figure 2A:
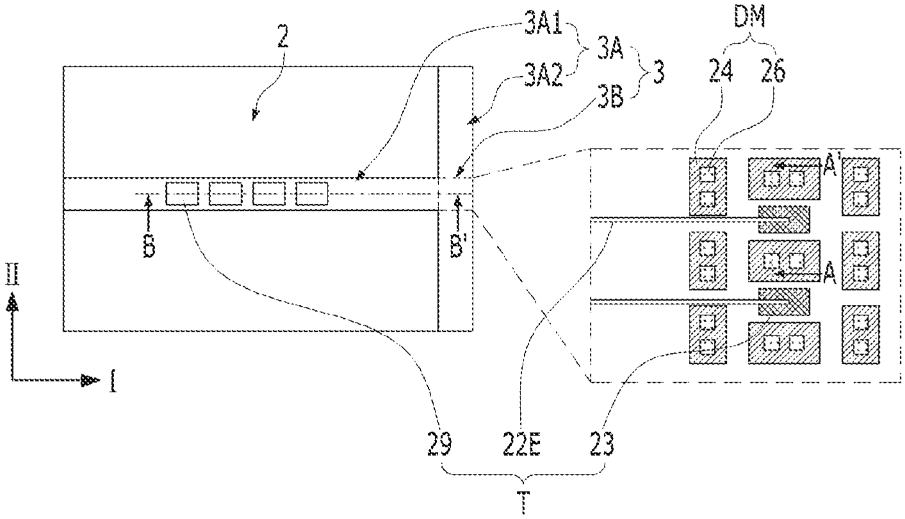
FIGS. 2A to 2C are diagrams illustrating structures of a semiconductor device according to an embodiment of the present disclosure.
Figure 2B:
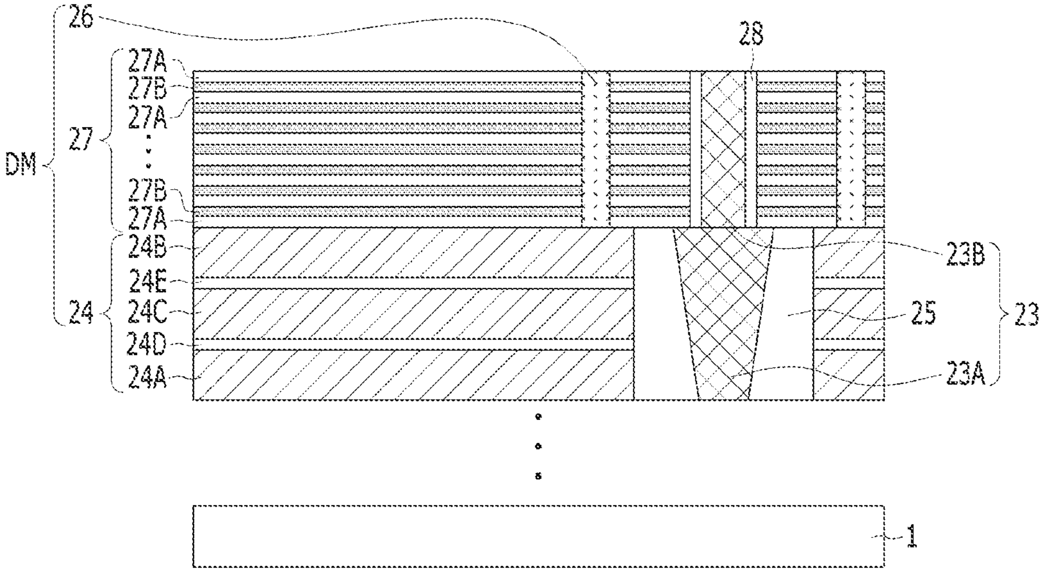
Figure 2C:
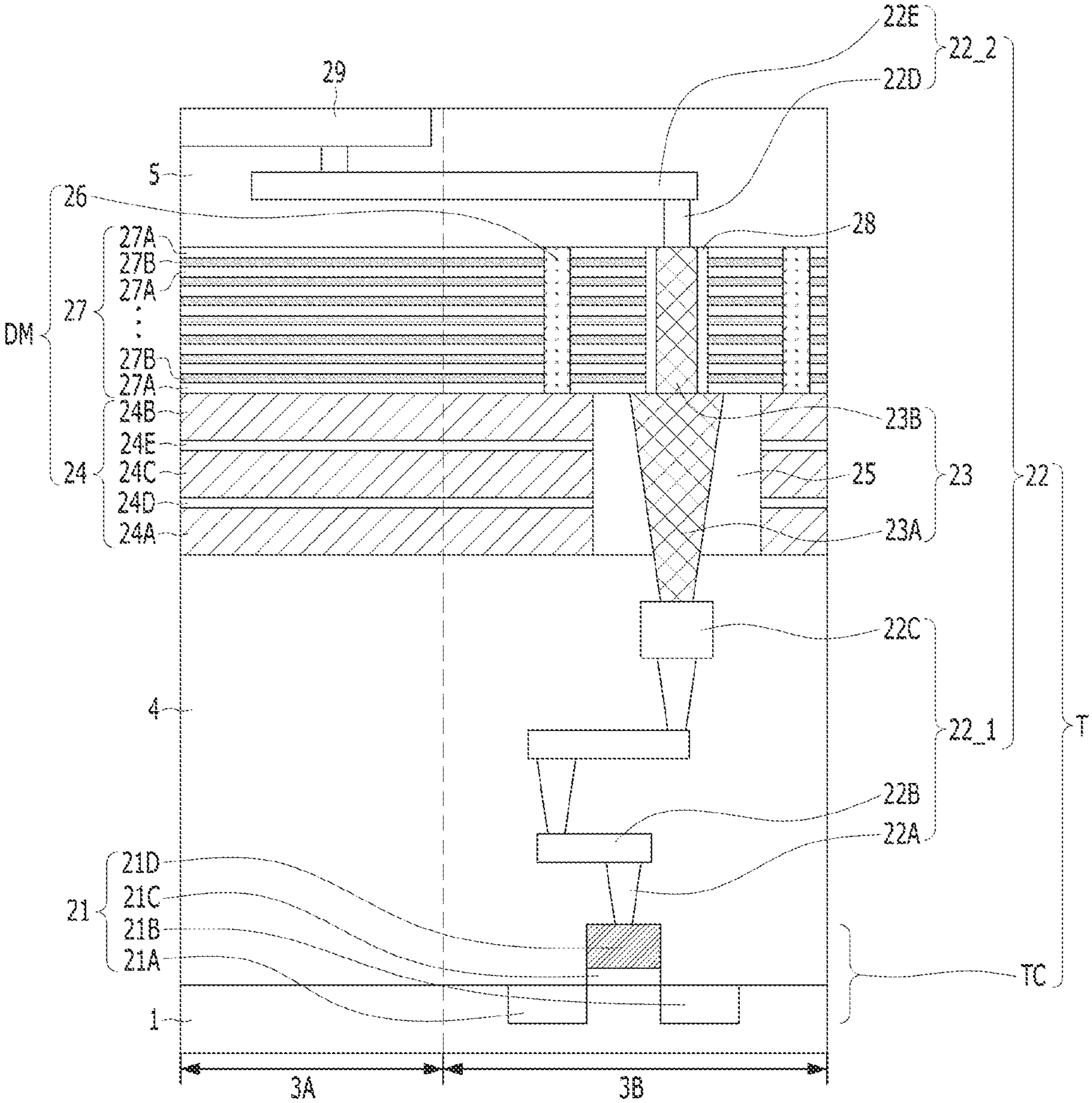

FIGS. 2A to 2C are diagrams illustrating structures of a semiconductor device according to an embodiment of the present disclosure. FIG. 2B may be a cross-sectional view of the semiconductor device taken along line A-A' in FIG. 2A. FIG. 2C may be a cross-sectional view of the semiconductor device taken along line B-B' in FIG. 2A. Hereinafter, redundant content is not repeated.

Referring to FIG. 2A, the semiconductor device may include a dummy structure DM or a test structure T disposed in the scribe lane area 3.

The dummy structure DM may be disposed in a line area 3A or cross area 3B of the scribe lane area 3. The dummy structure DM may include a dummy conductive pattern 24, a dummy contact plug 26, and/or a dummy stack in any combination.

The dummy conductive patterns 24 may be arranged in a first direction I and a second direction II. Each of the dummy conductive patterns 24 may have a shape that is extended in the first direction I or the second direction II.

The dummy contact plugs 26 may be arranged in the first direction I and the second direction II. The dummy contact plugs 26 may be connected to the dummy conductive patterns 24. For example, at least one dummy contact plug 26 may be connected to one dummy conductive pattern 24. The dummy contact plugs 26 may be arranged in the first direction I or the second direction II along the length direction of the dummy conductive pattern 24.

The test structure T may be disposed in the line area 3A or cross area 3B of the scribe lane area 3. The test structure T may include a test circuit, test pads 29, and/or an interconnection structure in any combination.

The interconnection structure may include contact plugs 23 or test lines 22E. The contact plugs 23 may be arranged in the first direction I or the second direction II. The contact plug 23 may be disposed between the dummy conductive patterns 24. For example, the contact plug 23 may be disposed between the dummy conductive patterns 24 each having a shape that extends in the first direction I.

The test line 22E may be disposed in the line area 3A or the cross area 3B. The test line 22E may connect the test circuit and the test pad 29 through the contact plug 23.

Referring to FIGS. 2A and 2B, the semiconductor device may include the substrate 1, the test structure T, and/or the dummy structure DM. The dummy structure DM may include the dummy conductive pattern 24, the dummy contact plug 26, and/or a dummy stack 27 in any combination.

The dummy conductive pattern 24 may be disposed in the cross area 3B. The dummy conductive pattern 24 may have a single-layer structure or a multi-layer structure. The dummy conductive pattern 24 may include a first dummy conductive pattern 24A, a second dummy conductive pattern 24B, and/or a third dummy conductive pattern 24C in any combination.

The first dummy conductive pattern 24A may be spaced apart from the dummy stack 27. The second dummy conductive pattern 24B may neighbor the dummy stack 27. The third dummy conductive pattern 24C may be between the first dummy conductive pattern 24A and the second dummy conductive pattern 24B. The first dummy conductive pattern 24A, the second dummy conductive pattern 24B, and/or the third dummy conductive pattern 24C may include a conductive material, such as polysilicon or metal.

The dummy conductive pattern 24 may further include a first protection layer 24D or a second protection layer 24E, but may further include a combination of them. The first protection layer 24D may be between the first dummy conductive pattern 24A and the third dummy conductive pattern 24C. The second protection layer 24E may be between the second dummy conductive pattern 24B and the third dummy conductive pattern 24C. Furthermore, the first protection layer 24D and/or the second protection layer 24E may include an insulating material, such as an oxide or a nitride.

The dummy stack 27 may be disposed in the cross area 3B. The dummy stack 27 may be disposed on the dummy conductive pattern 24. The dummy stack 27 may include a sacrificial layer 27B and an insulating layer 27A. For example, the dummy stack 27 may include the sacrificial layers 27B and the insulating layers 27A that are alternately stacked.

The dummy contact plug 26 may be disposed in the cross area 3B. The dummy contact plug 26 may penetrate the dummy stack 27. The dummy contact plug 26 may be disposed on the dummy conductive pattern 24. The dummy contact plug 26 may protrude from the top of the dummy conductive pattern 24. The dummy contact plug 26 may include an insulating material, such as an oxide.

The dummy conductive pattern 24, the dummy stack 27, and/or the dummy contact plug 26 may be broken when the substrate 1 is cut, thus being capable of preventing, reducing, or minimizing stress that is delivered to the chip areas 2. Accordingly, when the substrate 1 is cut, the chip areas 2 can be protected.

Contact plugs 23, a first spacer 25, and a second spacer 28 may be a part of the dummy structure DM or may be a part of the test structure T. The contact plugs 23 may be disposed in the cross area 3B. Each of the contact plugs 23 may include a first contact plug 23A and a second contact plug 23B. The first contact plug 23A may penetrate the dummy conductive pattern 24. The second contact plug 23B may penetrate the dummy stack 27. Each of the contact plugs 23 may include a conductive material, such as tungsten or metal.

Referring to FIGS. 2A and 2C, the semiconductor device may include the substrate 1, the test structure T, or the dummy structure DM. The test structure T may include a test circuit TC, a test pad 29, and/or an interconnection structure 22 in any combination.

The test circuit TC may be disposed in the cross area 3B. The test circuit TC may be disposed on the substrate 1. The test circuit TC may include a transistor 21, a capacitor, a register, etc. For example, the transistor 21 may include a first junction 21A, a second junction 21B, a gate insulating layer 21C, or a gate electrode 21D. The gate electrode 21D may be disposed over the substrate 1. The gate electrode 21D may include a conductive material. The first junction 21A and the second junction 21B may be disposed within the substrate 1 on both sides of the gate electrode 21D. The first junction 21A or the second junction 20B may include n type or p type impurities. The gate insulating layer 21C may be disposed between the gate electrode 21D and the substrate 1. The gate insulating layer 21C may include an insulating material, such as an oxide or a nitride.

The test pads 29 may be disposed in the line area 3A. The test pads 29 may be electrically connected to semiconductor chips, respectively. Furthermore, the test pads 29 may be electrically connected to the test circuit TC through the interconnection structure 22, and may be used to test the semiconductor chips.

The interconnection structure 22 may electrically connect the test pad 29 and the test circuit TC. The interconnection structure 22 may be disposed in the line area 3A or the cross area 3B. The interconnection structure 22 may include a first interconnection structure 22_1, contact plugs 23, and/or a second interconnection structure 22_2. The first interconnection structure 22_1 or the second interconnection structure 22_2 may include contact plugs 22A and 22D, test lines 22B and 22E or a connection pad 22C or may include a combination of them. A first interlayer insulating layer 4 may be disposed between the substrate 1 and the dummy conductive pattern 24. A second interlayer insulating layer 5 may be disposed on the dummy stack 27. The first interconnection structure 22_1 may be disposed within the first interlayer insulating layer 4. The second interconnection structure 22_2 may be disposed within the second interlayer insulating layer 5. The first interconnection structure 22_1 or the second interconnection structure 22_2 may include a conductive material, such as aluminum, copper, or tungsten.

Each of the contact plugs 23 may include the first contact plug 23A and the second contact plug 23B. The sidewall of the first contact plug 23A may be surrounded by the first spacer 25. The first spacer 25 may be for mutually insulating the dummy conductive pattern 24 and the first contact plug 23A. The first spacer 25 may include an insulating material, such as an oxide.

The second contact plug 23B may penetrate the dummy stack 27, and may be connected to the first contact plug 23A. The second contact plug 23B may be disposed on the first contact plug 23A. The second contact plug 23B may be electrically connected to the first contact plug 23A. The second contact plug 23B may include the same material as the first contact plug 23A or may include a material different from that of the first contact plug 23A. The second contact plug 23B may include a conductive material, such as tungsten or metal.

The sidewall of the second contact plug 23B may be surrounded by the second spacer 28. The second spacer 28 may be disposed between the dummy stack 27 and the second contact plug 23B. The second spacer 28 may include an insulating material, such as an oxide.

According to the aforementioned structure, the dummy structure DM may be disposed in the scribe lane area 3. When the substrate 1 is cut, the dummy structure DM may be broken, thus being capable of preventing, reducing, or minimizing stress that is delivered to the chip areas 2. Accordingly, when the substrate 1 is cut, the chip areas 2 can be protected. Furthermore, the dummy structure DM of the cross area 3B can absorb stress occurring when the substrate 1 is cut. Accordingly, although the test structure is disposed in the cross area 3B, the edges of the chip areas 2 can be protected.

Figure 3A:
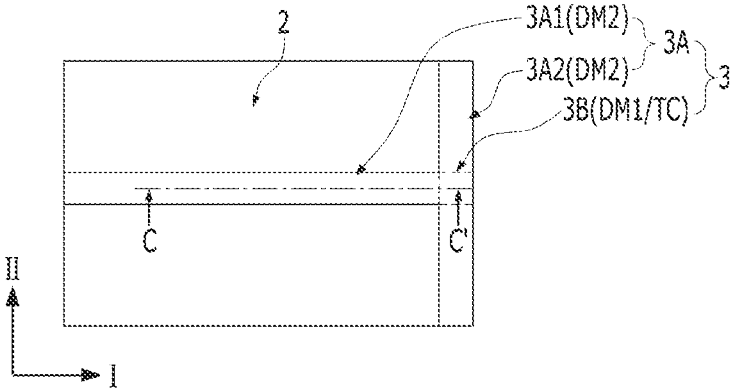
FIGS. 3A to 3C are diagrams illustrating structures of a semiconductor device according to an embodiment of the present disclosure.
Figure 3B:
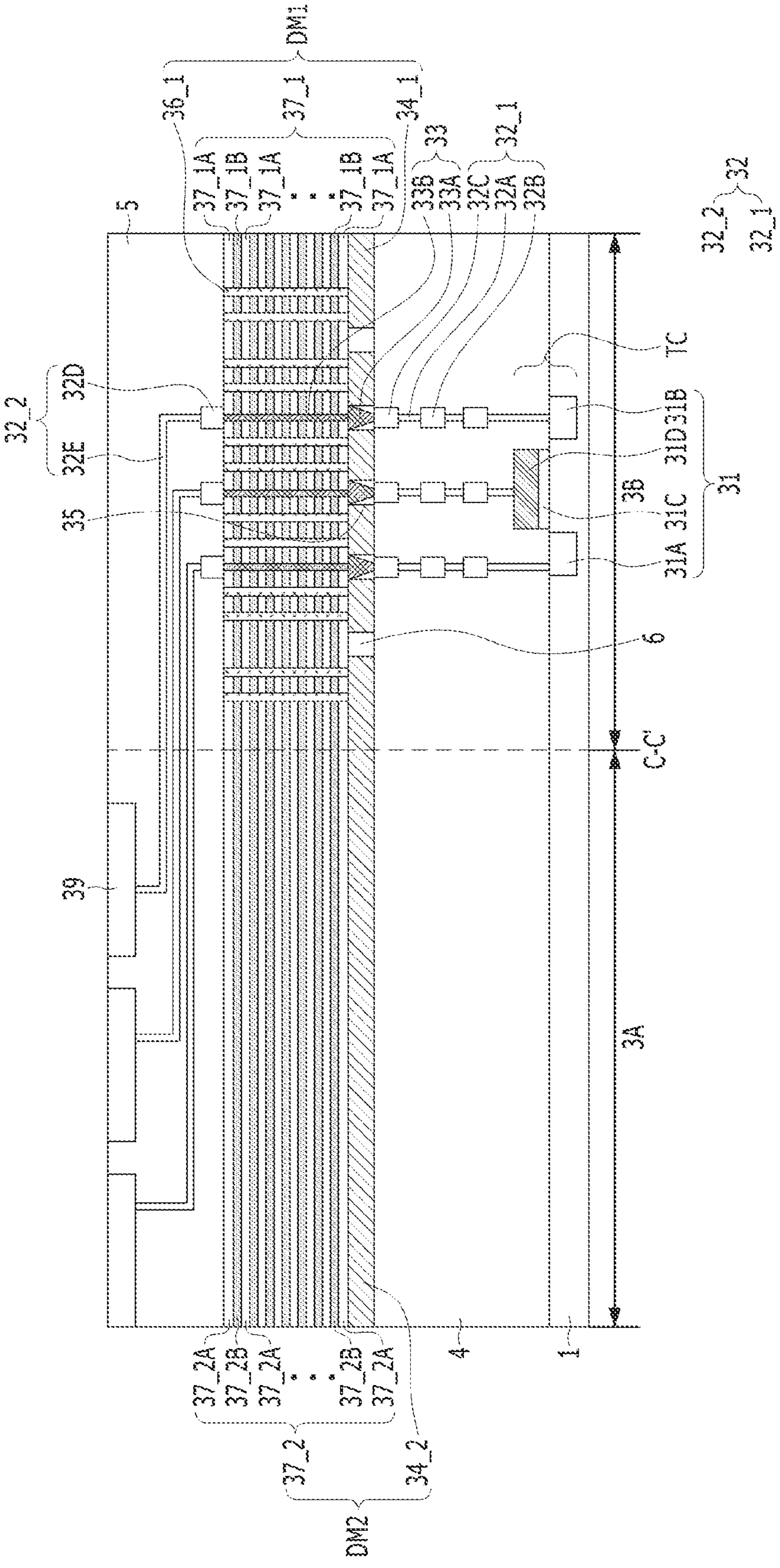
Figure 3C:
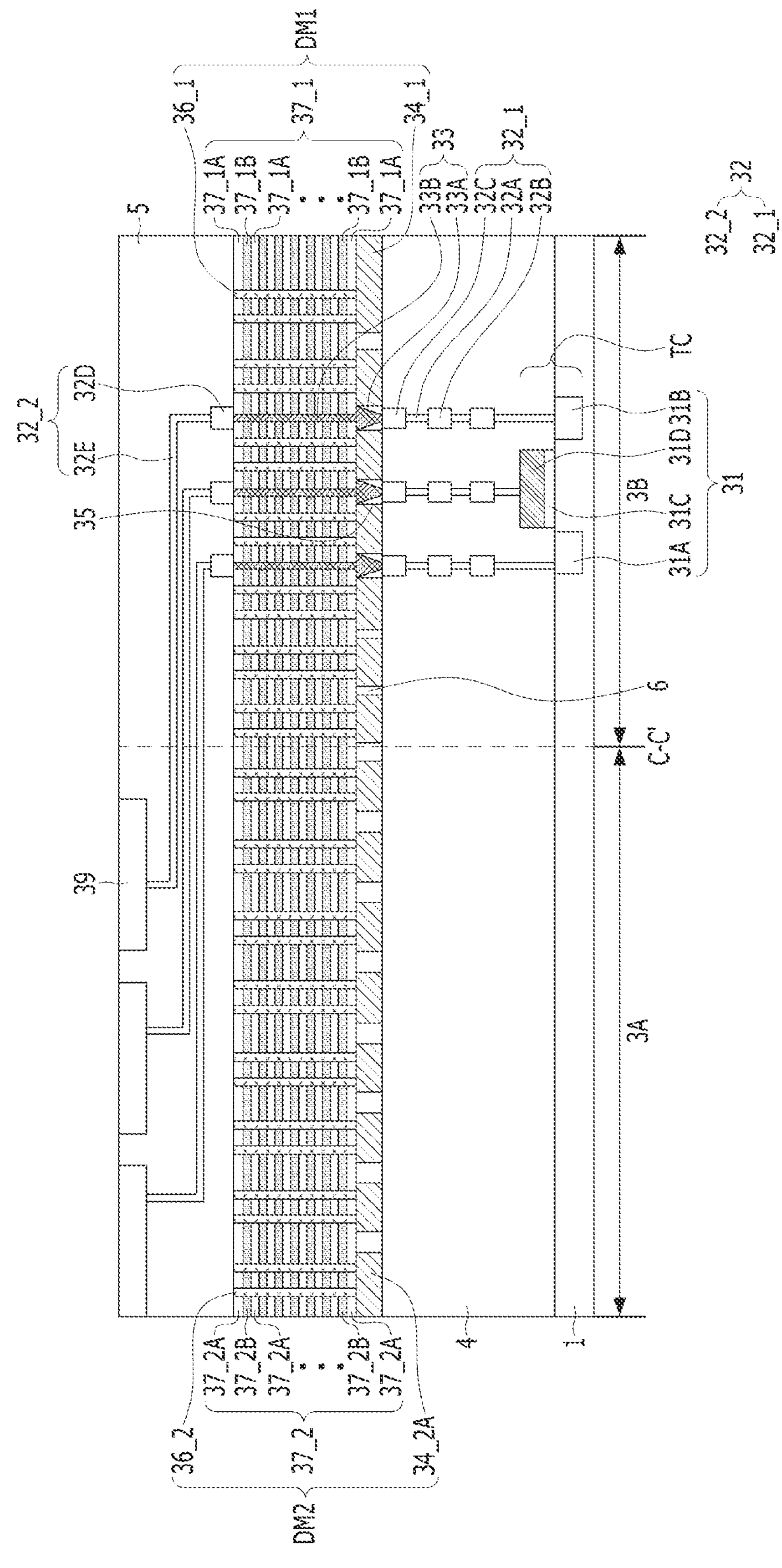

FIGS. 3A to 3C are diagrams illustrating structures of a semiconductor device according to an embodiment of the present disclosure. FIGS. 3B and 3C may be cross-sectional views of the semiconductor device taken along line C-C' in FIG. 3A. Hereinafter, redundant content is not repeated.

Referring to FIG. 3A, the semiconductor device may include a test structure T or a dummy structure DM disposed in a scribe lane area 3. The test structure T may be disposed in a line area 3A or cross area 3B of the scribe lane area 3. The dummy structure DM may be disposed in the line area 3A or cross area 3B of the scribe lane area 3.

Referring to FIGS. 3A and 3B, the semiconductor device may include a substrate 1, a first dummy structure DM1, a second dummy structure DM2, and/or the test structure T in any combination.

The first dummy structure DM1 may include a first dummy conductive pattern 34_1, a first dummy contact plug 36_1, and/or a first dummy stack 37_1 in any combination. The first dummy structure DM1 may be disposed in the cross area 3B.

The first dummy conductive pattern 34_1 may be disposed in the cross area 3B. Each of the first dummy conductive patterns 34_1 may be disposed in the cross area 3B. The first dummy conductive pattern 34_1 may have a single-layer structure or a multi-layer structure. The first dummy conductive patterns 34_1 may be spaced apart from each other. An insulating layer 6 may be disposed between the first dummy conductive patterns 34_1.

The first dummy stack 37_1 may be disposed in the cross area 3B. The first dummy stack 37_1 may be disposed on the first dummy conductive pattern 34_1. The first dummy stack 37_1 may include a first sacrificial layer 37_16 and a first insulating layer 37_1A. For example, the first dummy stack 37_1 may include the first sacrificial layers 37_16 and the first insulating layers 37_1A that are alternately stacked.

The first dummy contact plug 36_1 may be disposed in the cross area 3B. The first dummy contact plug 36_1 may penetrate the first dummy stack 37_1. The first dummy contact plug 36_1 may be disposed on the first dummy conductive pattern 34_1. The first dummy contact plug 36_1 may protrude from the first dummy conductive pattern 34_1. The first dummy contact plug 36_1 may include an insulating material, such as an oxide.

The second dummy structure DM2 may include a second dummy conductive pattern 34_2 and/or a second dummy stack 37_2. The second dummy structure DM2 may be disposed in the line area 3A.

The second dummy conductive pattern 34_2 may be disposed in the line area 3A. The second dummy conductive pattern 34_2 may be disposed at substantially the same level as the first dummy conductive pattern 34_1. The second dummy conductive pattern 34_2 may be connected to the first dummy conductive pattern 34_1 or may be spaced apart from the first dummy conductive pattern 34_1. The second dummy conductive pattern 34_2 may have a single-layer structure or a multi-layer structure.

The second dummy stack 37_2 may be disposed in the line area 3A. The second dummy stack 37_2 may be disposed on the second dummy conductive pattern 34_2. The second dummy stack 37_2 may be disposed at substantially the same level as the first dummy stack 37_1. The second dummy stack 37_2 may be connected to the first dummy stack 37_1 or may be spaced apart from the first dummy stack 37_1.

The second dummy stack 37_2 may include a second sacrificial layer 37_2B and a second insulating layer 37_2A. For example, the second dummy stack 37_2 may include the second sacrificial layers 37_2B and the second insulating layers 37_2A that are alternately stacked. The second sacrificial layer 37_2B may be disposed at substantially the same level as the first sacrificial layer 37_1B. The second sacrificial layer 37_2B and the first sacrificial layer 37_1B that are disposed at the levels corresponding to each other may be connected to or may be spaced apart from each other. The second insulating layer 37_2A may be disposed at substantially the same level as the first insulating layer 37_1A. The second insulating layer 37_2A and the first insulating layer 37_1A that are disposed at the levels corresponding to each other may be connected to or may be spaced apart from each other.

The test structure T may be dispersed in the cross area 3B and the line area 3A. The test circuit TC may be disposed in the cross area 3B. The test circuit TC may be disposed on the substrate 1. The test circuit TC may include a transistor 31.

For example, the transistor 31 may include a first junction 31A, a second junction 31B, a gate insulating layer 31C, and/or a gate electrode 31D. Test pads 39 may be disposed in the line area 3A. The test pads 39 may be electrically connected to semiconductor chips, respectively. Furthermore, the test pads 39 may be electrically connected to a test circuit TC through an interconnection structure 32, and may be used to test the semiconductor chips.

The interconnection structure 32 may electrically connect the test pad 29 and the test circuit TC. The interconnection structure 32 may be disposed in the line area 3A or the cross area 3B. The interconnection structure 32 may include a first interconnection structure 32_1, contact plugs 33, and/or a second interconnection structure 32_2. The first interconnection structure 32_1 or the second interconnection structure 32_2 may include contact plugs 32A and 32D, test lines 32B and 32E, and/or a connection pad 32C in any combination. The test lines 32E connected to different contact plugs 32D may be disposed at substantially the same level or may be disposed at different levels.

The contact plugs 33 may be disposed in the cross area 3B. Each of the contact plugs 33 may include a first contact plug 33A and a second contact plug 33B. The first contact plug 33A may penetrate the first dummy conductive pattern 34_1. The sidewall of the first contact plug 33A may be surrounded by a first spacer 35. The second contact plug 33B may penetrate the first dummy stack 37_1. Each of the contact plugs 33 may include a conductive material, such as tungsten or metal.

A first interlayer insulating layer 4 may be disposed between the substrate 1 and the first dummy conductive pattern 34_1 and between the substrate 1 and the second dummy conductive pattern 34_2. A second interlayer insulating layer 5 may be disposed on the first dummy stack 37_1 and the second dummy stack 37_2. The first interconnection structure 32_1 may be disposed within the first interlayer insulating layer 4. The second interconnection structure 32_2 may be disposed within the second interlayer insulating layer 5. The first interconnection structure 32_1 and/or the second interconnection structure 32_2 may include a conductive material, such as aluminum, copper, or tungsten.

Referring to FIGS. 3A and 3C, the semiconductor device may include the substrate 1, the first dummy structure DM1, the second dummy structure DM2, and/or the test structure T in any combination.

The second dummy structure DM2 may include the second dummy conductive pattern 34_2A, a second dummy contact plug 36_2, and/or the second dummy stack 37_2 in any combination.

The second dummy conductive pattern 34_2A may be disposed in the line area 3A. The second dummy conductive pattern 34_2A may have a shape similar to the first dummy conductive pattern 34_1. For example, the second dummy conductive patterns 34_2A may be connected to or may be spaced apart from each other. The second dummy conductive pattern 34_2A may be disposed at substantially the same level as the first dummy conductive pattern 34_1. The second dummy conductive pattern 34_2A may have a single-layer structure or a multi-layer structure.

The second dummy stack 37_2 may be disposed in the line area 3A. The second dummy stack 37_2 may be disposed on the second dummy conductive pattern 34_2A. The second dummy stack 37_2 may be disposed at substantially the same level as the first dummy stack 37_1. The second dummy stack 37_2 may include a sacrificial layer 37_2B and an insulating layer 37_2A.

The second dummy contact plug 36_2 may be disposed in the line area 3A. The second dummy contact plug 36_2 may penetrate the second dummy stack 37_2. The second dummy contact plug 36_2 may be disposed on the second dummy conductive pattern 34_2A. The second dummy contact plug 36_2 may be disposed at substantially the same level as the first dummy contact plug 36_1. The second dummy contact plug 36_2 may have a shape that protrudes from the top of the second dummy conductive pattern 34_2A. The second dummy contact plug 36_2 may include an insulating material, such as an oxide.

According to the aforementioned structure, the first dummy structure DM1 may be disposed in the cross area 3B, and the second dummy structure DM2 may be disposed in the line area 3A. Stress delivered to the chip areas 2 can be prevented, reduced, or minimized because the first dummy structure DM1 and the second dummy structure DM2 are successively broken when the substrate 1 is cut. Accordingly, when the substrate 1 is cut, the chip areas 2 can be protected.

Figure 4A:
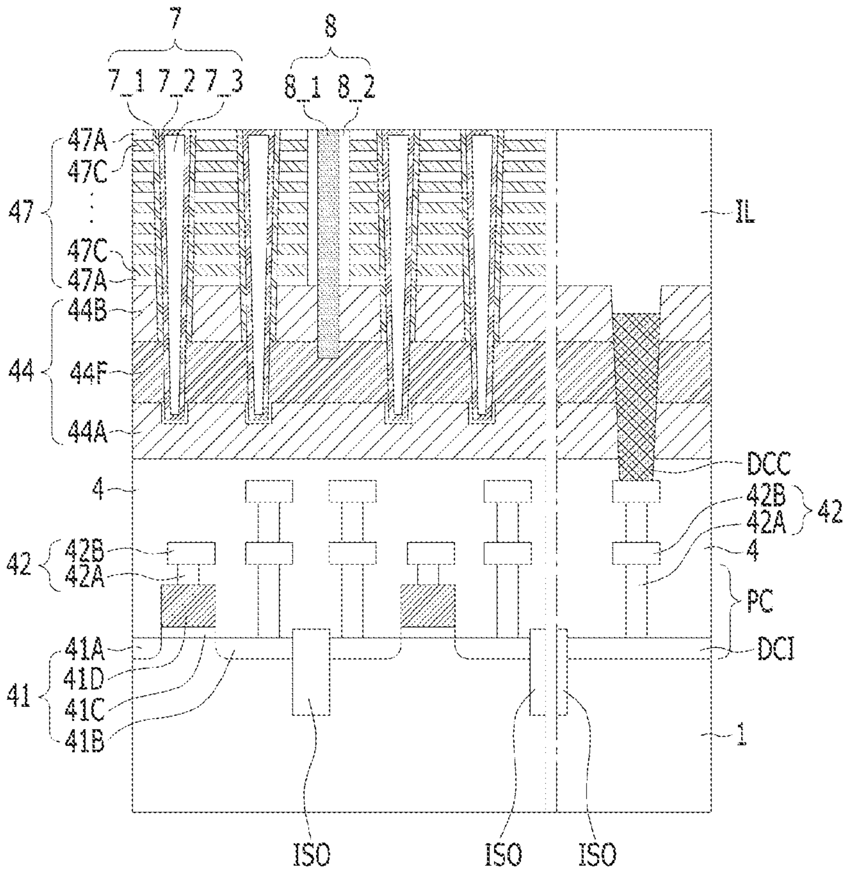
FIGS. 4A and 4B are diagrams illustrating structures of a semiconductor device according to an embodiment of the present disclosure.
Figure 4B:
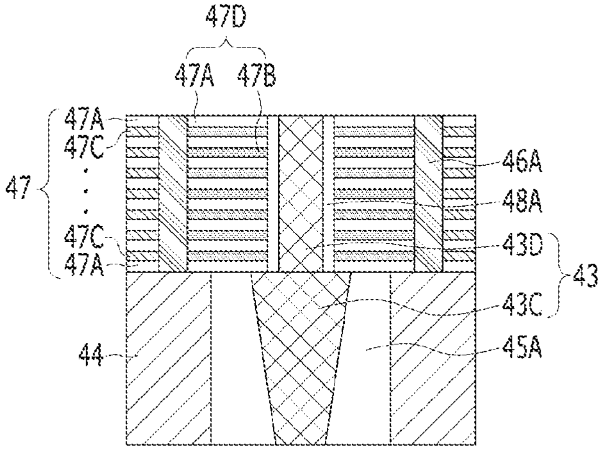

FIGS. 4A and 4B are diagrams illustrating structures of a semiconductor device according to an embodiment of the present disclosure. Hereinafter, redundant content is not repeated.

Referring to FIG. 4A, the semiconductor device may include a channel structure 7, a source contact structure 8, a source structure 44, and/or a cell stack 47 disposed in chip areas 2. The semiconductor device may further include a substrate 1, a transistor 41, an interconnection structure 42, and/or a discharge contact plug DCC in any combination.

The source structure 44 may have a single-layer structure or a multi-layer structure. The source structure 44 may be disposed at substantially the same level as the dummy conductive pattern 24, 34_1, 34_2, or 34_2A in FIG. 2B, 2C, 3B, or 3C. The source structure 44 may be formed when the dummy conductive pattern 24, 34_1, 34_2, or 34_2A is formed. The source structure 44 may include a first source layer 44A, a second source layer 44B, and/or a third source layer 44F in any combination. The source structure 44 may include a conductive material, such as polysilicon or metal.

The third source layer 44F may be disposed between the first source layer 44A and the second source layer 44B. The third source layer 44F may be disposed at substantially the same level as the third dummy conductive pattern 24C in FIG. 2B or 2C. The third source layer 44F may penetrate a memory layer 7_1, and may be connected to a channel layer 7_2. The third source layer 44F may include polysilicon.

The cell stack 47 may be disposed on the source structure 44. The cell stack 47 may be disposed at substantially the same level as the dummy stack 27, 37_1, 37_2 in FIG. 2B, 2C, 3B or 3C. When the dummy stack 27, 37_1, 37_2 is formed, the cell stack 47 may be formed. The cell stack 47 may include an insulating layer 47A and/or a conductive layer 47C. For example, the cell stack 47 may include the insulating layers 47A and the conductive layers 47C that are alternately stacked. In this case, the conductive layer 47C may include a metal material, such as tungsten. Furthermore, the conductive layer 47C may be a word line or a selection line.

The channel structure 7 may penetrate the cell stack 47. For example, the channel structure 7 may penetrate insulating layers 47A and the conductive layers 47C that are alternately stacked. The channel structure 7 may include the channel layer 7_2 that penetrates the cell stack 47. The channel structure 7 may further include at least one of the memory layer 7_1 that surrounds the sidewall of the channel layer 7_2 and an insulating core 7_3 within the channel layer 7_2. The channel layer 7_2 may include a semiconductor material, such as silicon or germanium. The memory layer 7_1 may include a blocking layer, a data storage layer, and/or a tunnel layer in any combination. The insulating core 7_3 may include an insulating material, such as an oxide, a nitride, or an air gap. The channel structure 7 may penetrate the cell stack 47, and may be connected to the source structure 44. For example, the channel layer 7_2 and the source structure 44 may be directly connected or the channel layer 7_2 and the source structure 44 may be connected through a semiconductor pattern that is grown by using an epitaxial method.

The source contact structure 8 may penetrate the cell stack 47. For example, the source contact structure 8 may penetrate the insulating layers 47A and the conductive layers 47C that are alternately stacked. The source contact structure 8 may be disposed at substantially the same level as the second contact plug 23B, 33B in FIG. 2B, 2C, 3B, or 3C. The source contact structure 8 may include a source contact plug 8_1, and may further include an insulating spacer 8_2. The source contact plug 8_1 may penetrate the cell stack 47, and may be connected to the source structure 44. For example, the source contact plug 8_1 may penetrate the cell stack 47, and may be electrically connected to the first source layer 44A. The source contact plug 8_1 may be formed when the second contact plug 23B, 33B is formed. The source contact plug 8_1 may be surrounded by the insulating spacer 8_2. The source contact plug 8_1 may include polysilicon, metal, etc. The insulating spacer 8_2 may include an insulating material, such as an oxide, a nitride, or an air gap.

A peripheral circuit PC may be disposed on the substrate 1. The substrate 1 may be a semiconductor substrate, such as a silicon wafer. An isolation film ISO may be disposed within the substrate 1. An active area may be defined by the isolation film ISO. The peripheral circuit PC may be disposed at substantially the same level as the test circuit TC in FIG. 2B, 3B, or 3C. The peripheral circuit PC may be formed when the test circuit TC is formed. The peripheral circuit PC may include the transistor 41, a capacitor, a register, etc. For example, the transistor 41 may include a first junction 41A, a second junction 41B, a gate insulating layer 41C, or a gate electrode 41D. The gate insulating layer 41C may be disposed between the gate electrode 41D and the substrate 1. The gate insulating layer 41C and the isolation film ISO may include an insulating material, such as an oxide or a nitride.

The interconnection structure 42 may include contact plugs 42A, lines 42B, etc. A first interlayer insulating layer 4 may be disposed between the substrate 1 and the source structure 44. The interconnection structure 42 may be disposed within the first interlayer insulating layer 4. The interconnection structure 42 may be disposed at substantially the same level as the interconnection structure 22_1, 32_1 in FIG. 20, 3B, or 3C. The interconnection structure 42 may be formed when the interconnection structure 22_1, 32_1 is formed. The contact plug 42A or the line 42B may include a conductive material, such as aluminum, copper, or tungsten.

The discharge contact plug DCC may penetrate the source structure 44. The discharge contact plug DCC may be disposed at substantially the same level as the first contact plug 23A, 33A in FIG. 2B, 2C, 3B, or 3C. The discharge contact plug DCC may be formed when the first contact plug 23A, 33A is formed. The discharge contact plug DCC may be for discharging electric charges accumulated within the source structure 44 in a process of manufacturing the semiconductor device. The discharge contact plug DCC may be connected to the substrate 1 through the interconnection structure 42. For example, the substrate 1 may include a discharge impurity area DCI. The discharge contact plug DCC may be connected to the discharge impurity area DCI through the interconnection structure 42. An insulating layer IL may be disposed on the discharge contact plug DCC. The insulating layer IL may be disposed at substantially the same level as the cell stack 47 and or may be disposed at a level different from that of the cell stack 47.

Referring to FIGS. 4A and 4B, a semiconductor device may include a source structure 44, a cell stack 47, contact plugs 43, a dummy cell stack 47D, a support 46A, and/or a first insulating spacer 45A disposed in chip areas 2 in any combination.

The cell stack 47 may be disposed on the source structure 44. The cell stack 47 may include an insulating layer 47A and/or a conductive layer 47C. For example, the cell stack 47 may include the conductive layers 47C and the insulating layers 47A that are alternately stacked. The conductive layers 47C may be a word line, a bit line, a selection line, etc.

The dummy cell stack 47D may be disposed on the source structure 44. The dummy cell stack 47D may be disposed at substantially the same level as the cell stack 47. The dummy cell stack 47D may be disposed at substantially the same level as the dummy stack 27, 37_1, 37_2 in FIG. 2B, 2C, 3B, or 3C. The dummy cell stack 47D may be formed when the dummy stack 27, 37_1, 37_2 is formed. The dummy cell stack 47D may include the insulating layer 47A and/or a sacrificial layer 47B. For example, the dummy cell stack 47D may include the insulating layers 47A and the sacrificial layers 47B that are alternately stacked. The sacrificial layer 47B may remain without being replaced with the conductive layer 47C in a manufacturing process thereof. The sacrificial layers 47B and the conductive layers 47C may be disposed at levels corresponding to each other.

Each of the contact plugs 43 may include a first contact plug 43C and a second contact plug 43D. The first contact plug 43C may penetrate the source structure 44. The first contact plug 43C may be surrounded by the first insulating spacer 45A. The first contact plug 43C may be disposed at substantially the same level as the discharge contact plug DCC or the first contact plug 23A, 33A in FIG. 2B, 2C, 3B, or 3C.

The second contact plug 43D may penetrate the dummy cell stack 47D. The second contact plug 43D may be surrounded by a second insulating spacer 48A. The second contact plug 43D may be disposed at substantially the same level as the second contact plug 23B, 33B in FIG. 2B, 2C, 3B, or 3C. The second contact plug 43D may be formed when the second contact plug 23B, 33B is formed. Each of the contact plugs 43 may include a conductive material, such as tungsten or metal.

The support 46A may be disposed on the source structure 44. The support 46A may penetrate the cell stack 47 or the dummy cell stack 47D. For example, the support 46A may penetrate the insulating layers 47A and the conductive layers 47C that are alternately stacked. The support 46A may penetrate the sacrificial layers 47B and the insulating layers 47A that are alternately stacked. The support 46A may be disposed at substantially the same level as the dummy contact plug 26, 36_1, 36_2 in FIG. 2B, 2C, 3B, or 3C. The support 46A may be formed when the dummy contact plug 26, 36_1, 36_2 is formed.

The support 46A may be disposed on the source structure 44. The support 46A may be disposed between the cell stack 47 and the dummy cell stack 47D. The support 46A may be disposed at substantially the same level as the dummy contact plug 26, 36_1, 36_2 in FIG. 2B, 2C, 3B, or 3C. The support 46A may be formed when the dummy contact plug 26, 36_1, 36_2 is formed. The support 46A may be for preventing the cell stack 47 or the dummy cell stack 47D from leaning or minimizing the leaning of the cell stack 47 or the dummy cell stack 47D in a process of replacing the sacrificial layers 47B with the conductive layers 47C. For example, the sacrificial layers 47B on one side of the support 46A may be replaced with the conductive layers 47C, and the sacrificial layers 47B on the other side of the support 46A may remain. The support 46A may include an insulating material, such as an oxide, a nitride, or an air gap.

According to the aforementioned structure, the source structure 44 disposed in the chip areas 2 and the dummy conductive pattern 24, 34_1, 34_2, or 34_2A of the scribe lane area 3 may be disposed at levels corresponding to each other, and may have similar structures. Furthermore, the cell stack 47 or the dummy cell stack 47D and the dummy stack 27, 37_1, 37_2 may be disposed at levels corresponding to each other, and may have similar structures. Furthermore, the support 46A and the dummy contact plug 26, 36_1, 36_2 may be disposed at levels corresponding to each other, and may have similar structures.

The dummy structure may be formed in the scribe lane area 3 when semiconductor chips are formed in the chip areas 2. Accordingly, the dummy structure may be formed in the scribe lane area 3 without adding a separate process.

Figure 5:
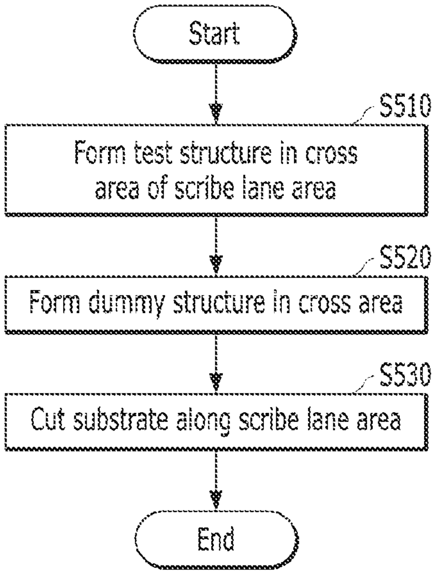
FIG. 5 is a flowchart of a method of manufacturing a semiconductor device according to an embodiment of the present disclosure.

FIG. 5 is a flowchart of a method of manufacturing a semiconductor device according to an embodiment of the present disclosure.

Referring to FIG. 5, at least a part of a test structure may be formed in a scribe lane area of a substrate (S510). The scribe lane area may be disposed between chip areas of the substrate. The scribe lane area may include a line area and a cross area in which the line areas are intersected. The test structure may include a test circuit.

Next, at least a part of a first dummy structure may be formed in the scribe lane area of the substrate (S520). The first dummy structure may include a dummy conductive layer, a dummy stack, or a dummy contact plug. A second dummy structure may be formed when the first dummy structure is formed. The first dummy structure may be disposed in the cross area. The second dummy structure may be disposed in the line area. For reference, the test structure may be formed after the first dummy structure is formed or the test structure may be formed when the first dummy structure is formed.

Next, the substrate may be cut along the scribe lane area (S530). When the substrate is cut, the first dummy structure may be broken. The chip areas can be protected as the first dummy structure is broken.

Figure 6:
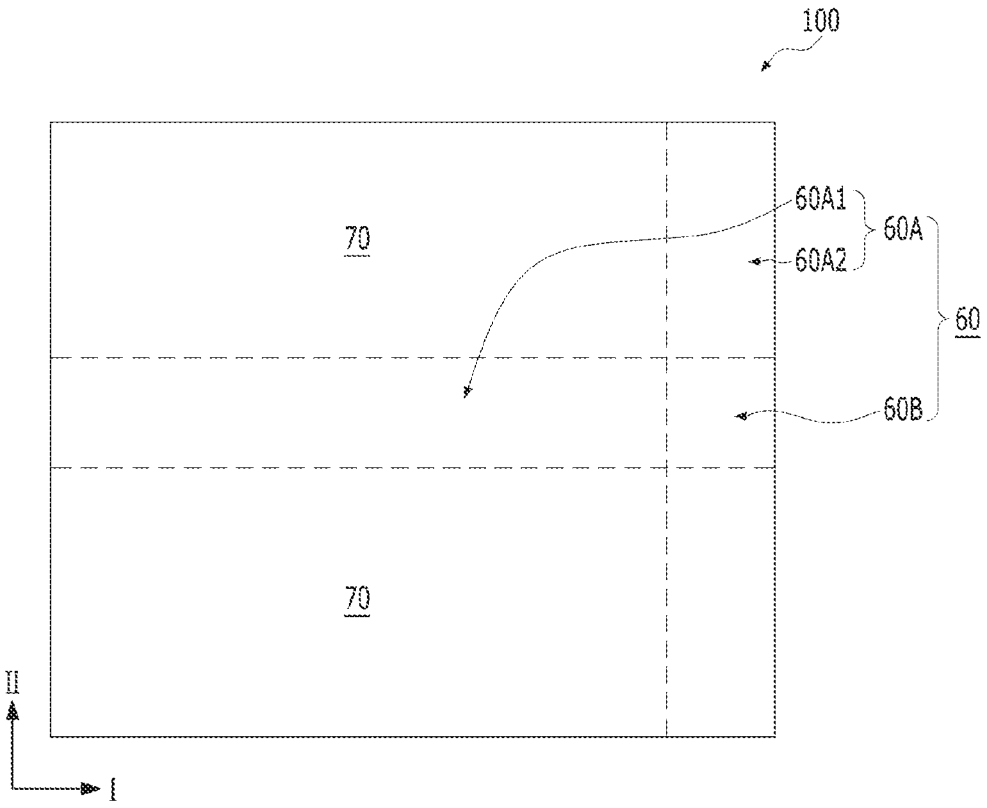
FIGS. 6, 7A and 7B, 8A and 8B, 9A and 9B, 10A and 10B, 11A and 11B, 12A and 12B, 13A and 13B, 14, and 15 are diagrams for describing a method of manufacturing a semiconductor device according to an embodiment of the present disclosure.
Figure 14:
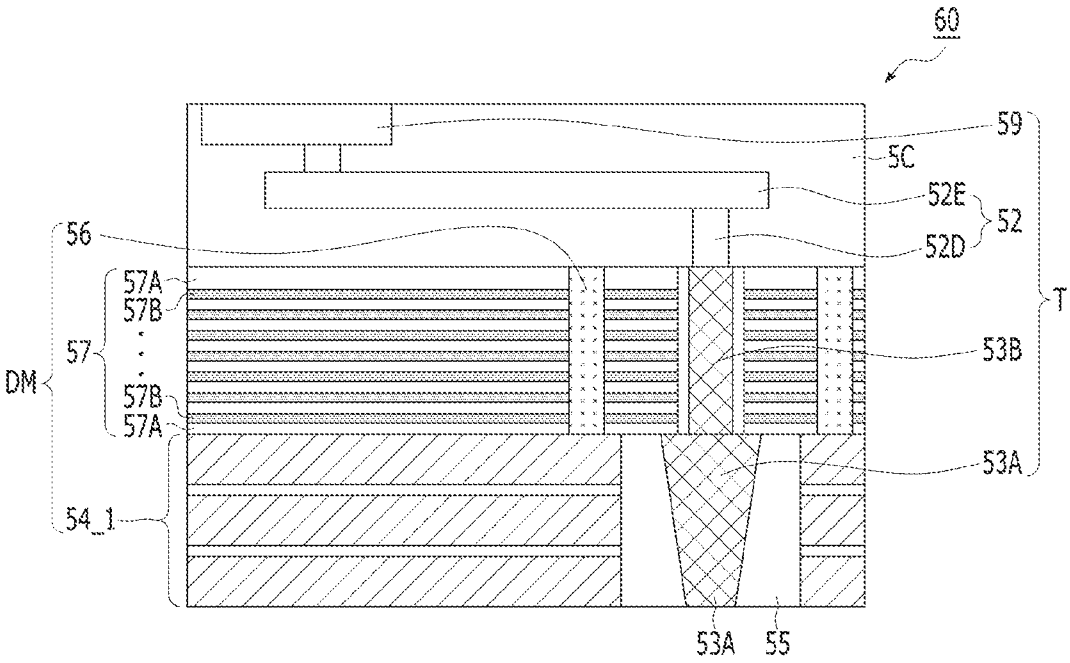
Figure 15:
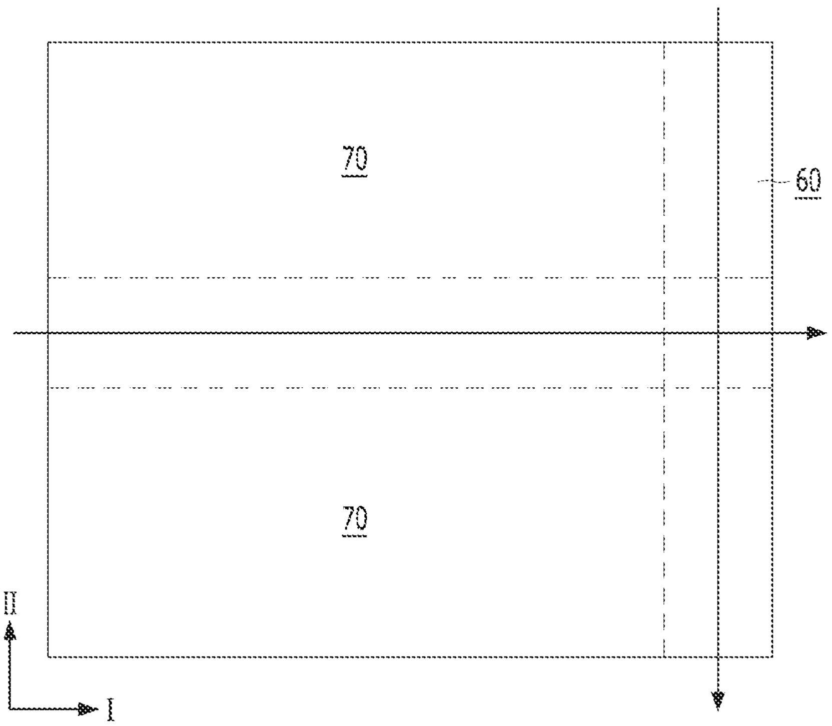

FIGS. 6, 7A and 7B, 8A and 8B, 9A and 9B, 10A and 10B, 11A and 11B, 12A and 12B, 13A and 13B, and 14 and 15 are diagrams for describing a method of manufacturing a semiconductor device according to an embodiment of the present disclosure. FIG. 6 may be a layout of a substrate. Each of FIGS. 7A, 8A, 9A, 10A, 11A, 12A, and 13A may be a cross-sectional view of a scribe lane area 60, and each of FIGS. 7B, 8B, 9B, 10B, 11B, 12B, and 13B may be a cross-sectional view of a chip area 70. FIG. 14 may be a cross-sectional view of the scribe lane area 60. FIG. 15 may be a layout of the substrate.

Referring to FIG. 6, the substrate 100 may include the scribe lane area 60 and the chip area 70. The scribe lane area 60 may include a line area 60A and a cross area 60B. The line area 60A may include a first area 60A1 that is extended in a first direction I or a second area 60A2 that is extended in a second direction II that intersects the first direction I. The cross area 60B may be an area in which the line areas 60A are intersected. The cross area may be an area in which the first area 60A1 and the second area 60A2 are intersected. The chip area 70 may be an area in which semiconductor chips will be formed. The scribe lane area 60 may be disposed between the chip areas 70.

Figure 7A:
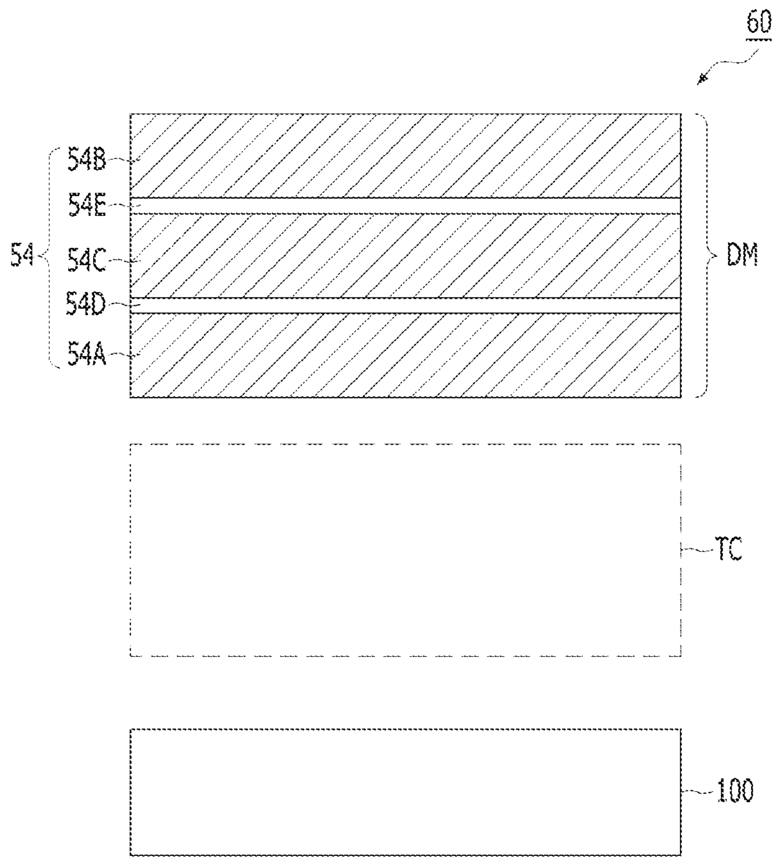

Referring to FIGS. 6 and 7A, a test structure for testing a semiconductor chip may be formed in the scribe lane area 60 of the substrate 100. The test structure may be formed in the line area 60A or the cross area 60B. The test structure may include a test circuit TC, test pads, an interconnection structure that electrically connects the test circuits and the test pads, etc.

The test circuit TC may be formed in the cross area 60B of the substrate 100. The test circuit TC may include a transistor, a capacitor, a register, etc. The interconnection structure may be formed on the test circuit TC. The interconnection structure may be electrically connected to the test circuit TC. The interconnection structure may include test lines, contact plugs, or a connection pad. For reference, at least a part of the test circuit TC may be formed in the line area 60A.

A dummy structure DM may be formed in the line area 60A and/or the cross area 60B. The dummy structure DM may include a dummy conductive layer 54, a dummy stack, and/or a dummy contact plug in any combination. The dummy structure DM to be formed in the cross area 60B may be defined as a first dummy structure. The dummy structure DM to be formed in the line area 60A may be defined as a second dummy structure. The first dummy structure and the second dummy structure may be simultaneously formed or may be formed through separate processes.

The dummy conductive layer 54 may be formed in the line area 60A or the cross area 60B. The dummy conductive layer 54 may include a first dummy conductive layer 54A, a first protection layer 54D, a third dummy conductive layer 54C, a second protection layer 54E, and/or a second dummy conductive layer 54B in any combination.

Figure 7B:
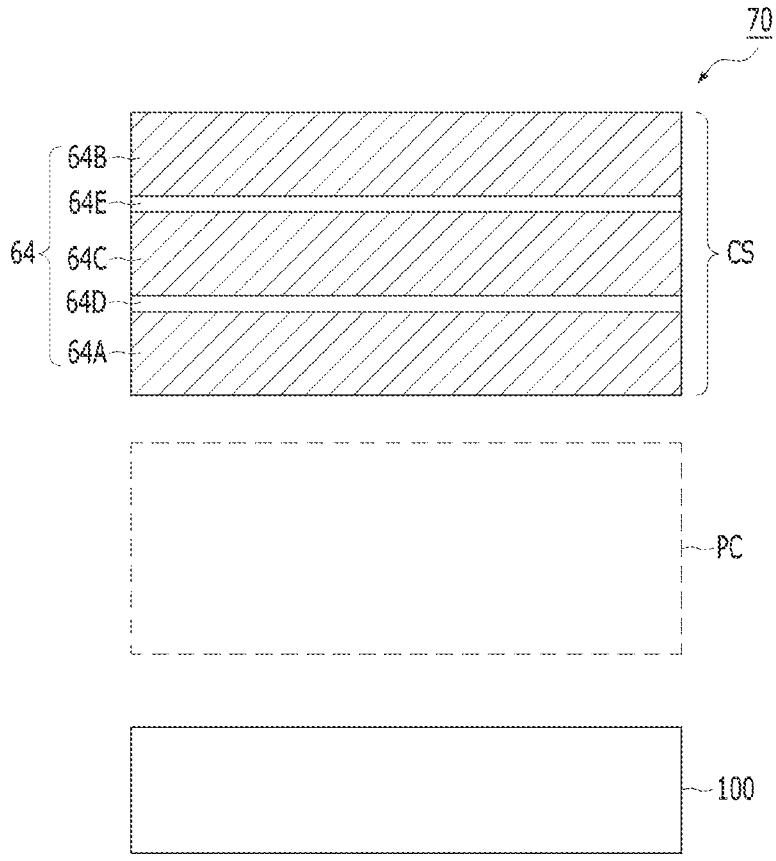

Referring to FIGS. 6, 7A, and 7B, a peripheral circuit PC may be formed in the chip areas 70 of the substrate 100. The peripheral circuit PC may include a transistor, a capacitor, a register, etc. The peripheral circuit PC may be formed in the chip areas 70 when the test circuit TC is formed in the scribe lane area 60.

A cell structure CS may be formed on the peripheral circuit PC. The cell structure CS may include a source layer 64, a cell stack, a dummy cell stack, and/or a support in any combination. The cell structure CS may be formed in the chip areas 70 when the dummy structure DM is formed in the scribe lane area 60.

The source layer 64 may be formed in the chip areas 70. The source layer 64 may be formed in the chip areas 70 when the dummy conductive layer 54 is formed in the scribe lane area 60. The source layer 64 may include a first source layer 64A, a first protection layer 64D, a source sacrificial layer 64C, a second protection layer 64E, and/or a second source layer 64B in any combination. The source sacrificial layer 64C may be replaced with a third source layer in a subsequent process. The source layer may include a conductive material, such as polysilicon or metal.

Figure 8A:
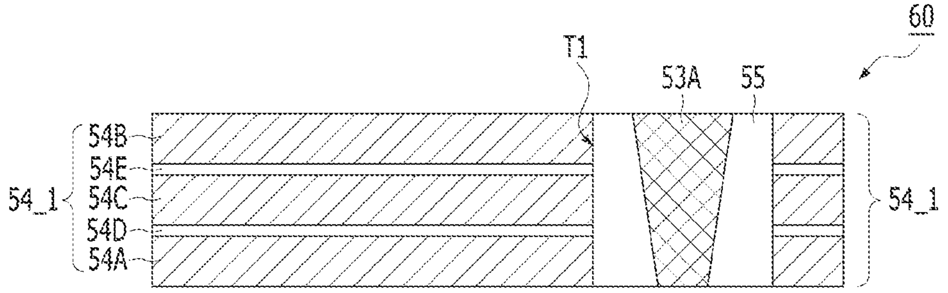

Referring to FIGS. 6 and 8A, a first contact plug 53A that penetrates the dummy conductive layer 54 may be formed in the scribe lane area 60. First, a first trench T1 may be formed by etching the dummy conductive layer 54. Accordingly, the dummy conductive layer 54 may be patternized as dummy conductive patterns 54_1. Next, the first contact plug 53A may be formed within the first trench T1. The first contact plug 53A may be electrically connected to the test circuit TC. The first contact plug 53A may include a conductive material, such as tungsten or metal.

Before the first contact plug 53A is formed, a first spacer 55 may be formed on the inner wall of the first trench T1. The first spacer 55 may be formed in a way that a spacer layer is formed to fully fill the first trench T1 and then the spacer layer is etched by using a mask pattern as an etch barrier. Alternatively, after a spacer layer is conformally formed along contours of the inner surface of the first trench T1, the first spacer 55 may be formed by etching the spacer layer through full etchback. The first spacer 55 may include an insulating material, such as an oxide or a nitride.

Figure 8B:
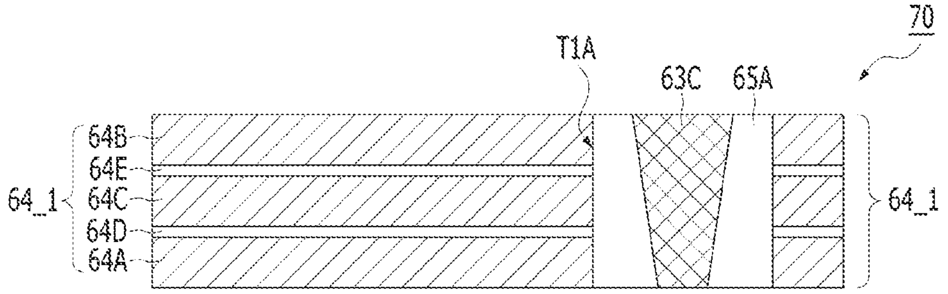

Referring to FIGS. 6, 8A, and 8B, a first contact plug 63C that penetrates the source layer 64 may be formed in the chip areas 70. The first contact plug 63C of the chip area 70 may be formed when the first contact plug 53A of the scribe lane area 60 is formed. First, a first trench T1A may be formed by etching the source layer 64. Accordingly, the source layer 64 may be patternized as a source structure 64_1. The first contact plug 63C may be formed within the first trench T1A. The first contact plug 63C may include a conductive material, such as tungsten or metal. The first contact plug 63C may be electrically connected to the peripheral circuit PC.

A first insulating spacer 65A of the chip areas 70 may be formed when the first spacer 55 of the scribe lane area 60 is formed. The first insulating spacer 65A may include an insulating material, such as an oxide or a nitride.

Figure 9A:
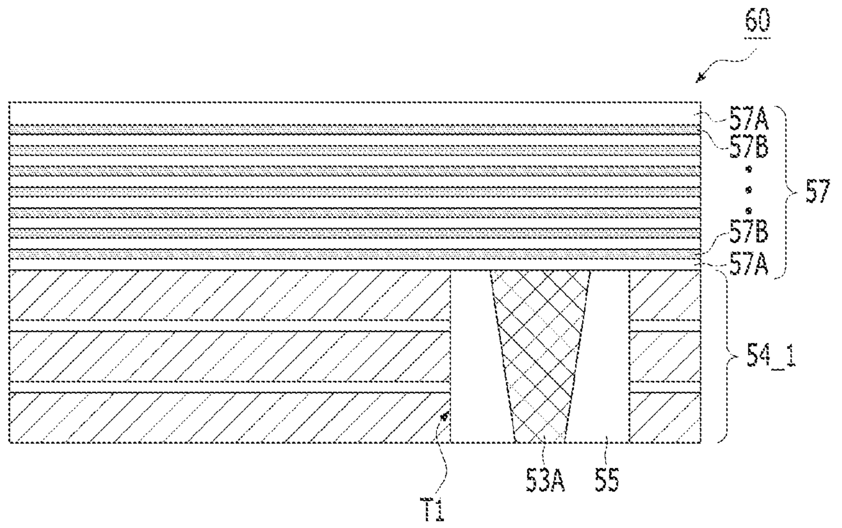

Referring to FIGS. 6 and 9A, a dummy stack 57 may be formed in the scribe lane area 60. The dummy stack 57 may be formed on dummy conductive patterns 54_1. The dummy stack 57 may include first material layers 57A and second material layers 57B that are alternately stacked. The first material layers 57A may include an insulating material, such as an oxide, and the second material layers 57B may include a sacrificial material, such as a nitride.

Figure 9B:
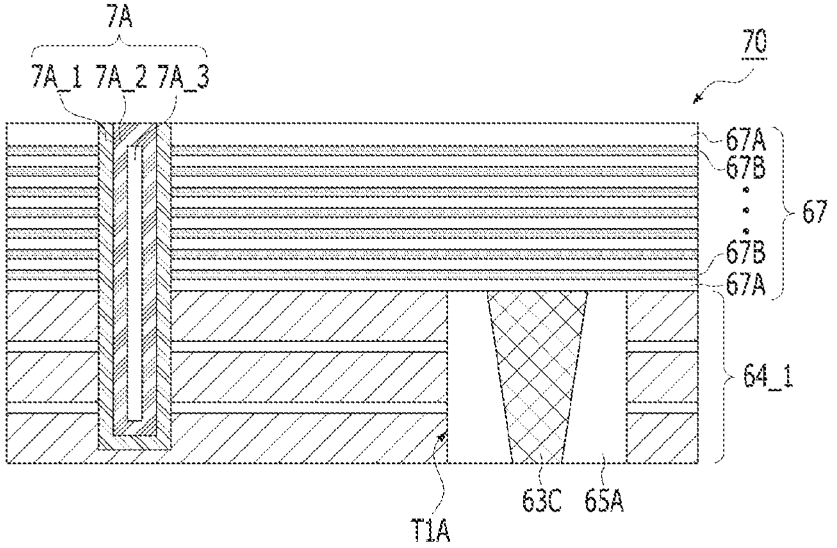

Referring to FIGS. 6, 9A, and 9B, a cell stack 67 may be formed in the chip areas 70. The cell stack 67 may be formed on the source structure 64_1. The cell stack 67 may be formed in the chip areas 70 when the dummy stack 57 of the scribe lane area 60 is formed. The cell stack 67 may include first material layers 67A and second material layers 67B that are alternately stacked. The first material layers 67A may include an insulating material, such as an oxide, and the second material layers 67B may include a sacrificial material, such as a nitride.

Next, a channel structure 7A connected to the source structure 64_1 may be formed in the chip areas 70. The channel structure 7A may include a channel layer 7A_2. The channel structure 7A may further include at least one of a memory layer 7A_1 that surrounds the sidewall of the channel layer 7A_2 and an insulating core 7A_3 within the channel layer 7A_2. The channel layer 7A_2 may include a semiconductor material, such as silicon or germanium. The memory layer 7A_1 may include a blocking layer, a data storage layer, and/or a tunnel layer in any combination. The insulating core 7A_3 may include an insulating material, such as an oxide, a nitride, or an air gap.

Figure 10A:
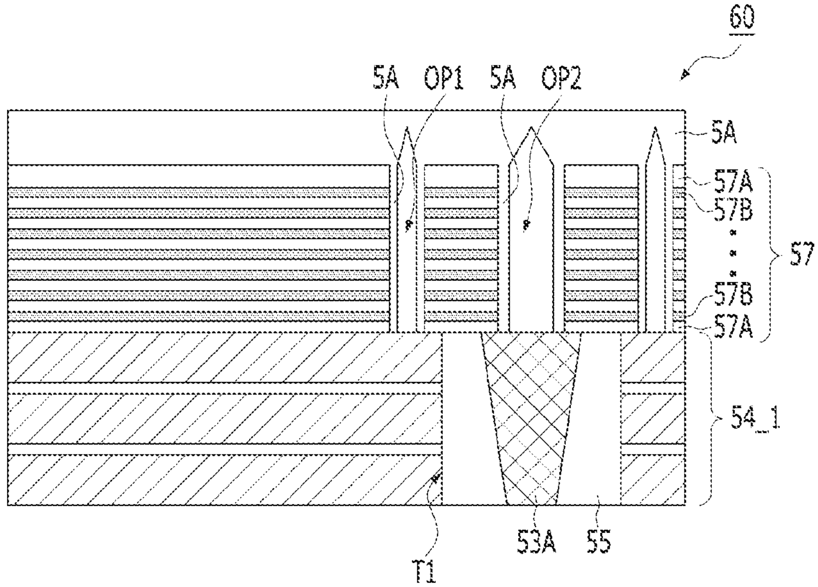

Referring to FIGS. 6 and 10A, a first opening OP1 may be formed in the scribe lane area 60. The first opening OP1 may penetrate the dummy stack 57, and may expose the dummy conductive patterns 54_1. A second opening OP2 may be formed in the scribe lane area 60. The second opening OP2 may penetrate the dummy stack 57, and may expose the first contact plug 53A. The first opening OP1 and the second opening OP2 may be simultaneously formed or may be formed through separate processes. The first opening OP1 and the second opening OP2 may have substantially the same width or may have different widths.

Next, a first capping layer 5A may be formed on the dummy stack 57. The first capping layer 5A may be formed on the dummy stack 57, and may seal the first opening OP1 or the second opening OP2. The first capping layer 5A may be formed along the inner surface of the first opening OP1 or the second opening OP2. The first capping layer 5A may be formed along the inner surface of the first opening OP1 or the second opening OP2 to a thickness that does not fully fill the first opening OP1 or the second opening OP2. The first capping layer 5A may include an insulating material, such as an oxide or a nitride.

Figure 10B:
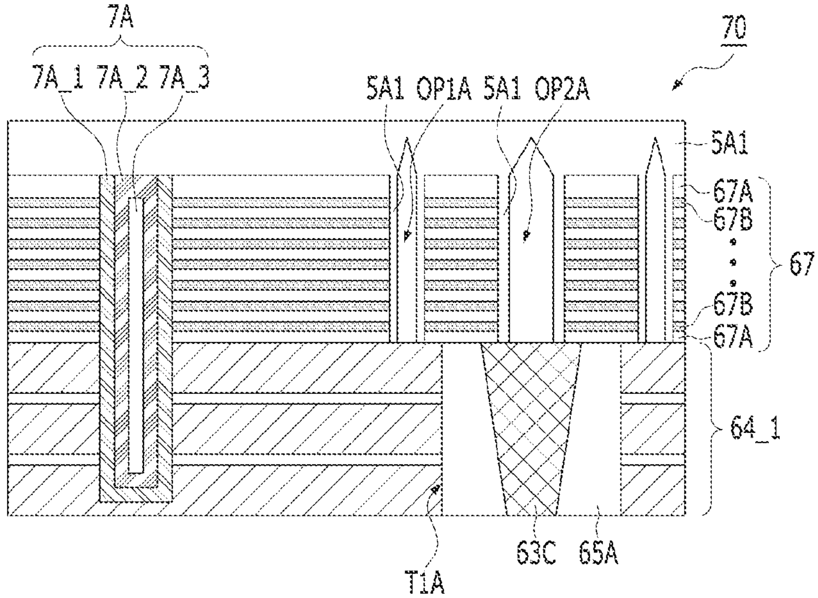

Referring to FIGS. 6, 10A, and 10B, a first opening OP1A or a second opening OP2A may be formed in the chip areas 70. The first opening OP1A may penetrate the cell stack 67, and may expose the source structure 64_1. The second opening OP2A may penetrate the cell stack 67, and may expose the first contact plug 63C. The first opening OP1A and the second opening OP2A may be simultaneously formed or may be formed through separate processes. The first opening OP1A of the chip areas 70 may be formed when the first opening OP1 of the scribe lane area 60 is formed. The second opening OP2A of the chip areas 70 may be formed when the second opening OP2 of the scribe lane area 60 is formed.

Next, a first capping layer 5A1 may be formed on the cell stack 67. The first capping layer 5A1 of the chip areas 70 may be formed when the first capping layer 5A of the scribe lane area 60 is formed. The first capping layer 5A1 may be formed on the cell stack 67, and may seal the first opening OP1A or the second opening OP2A. The first capping layer 5A1 may be formed along the inner surface of the first opening OP1A or the second opening OP2A. The first capping layer 5A1 may include an insulating material, such as an oxide or a nitride.

Figure 11A:
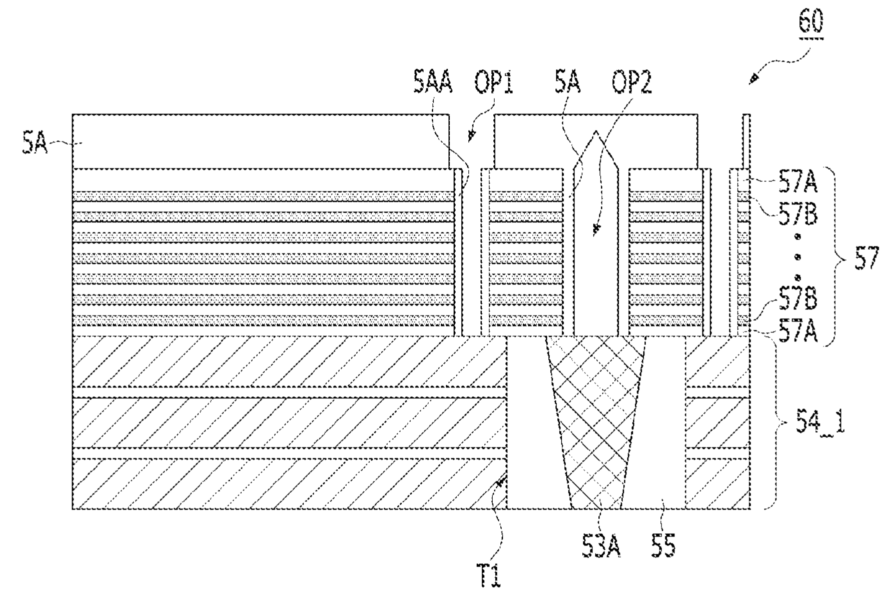

Referring to FIGS. 6 and 11A, the first opening OP1 of the scribe lane area 60 may be selectively opened. For example, the first opening OP1 may be opened in a way to etch the first capping layer 5A by using a mask pattern as an etch barrier. Next, the dummy conductive pattern 54_1 may be exposed by etching the first capping layer 5A formed at the bottom of the first opening OP1. Accordingly, a first capping pattern 5AA may remain on the inner wall of the first opening OP1.

Figure 11B:
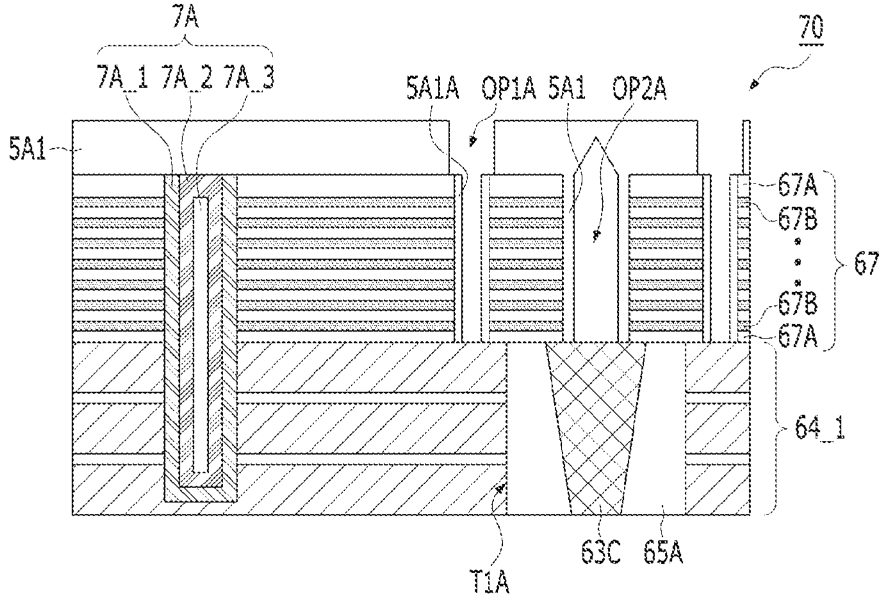

Referring to FIGS. 6, 11A, and 11B, the first opening OP1A of the chip areas 70 may be selectively opened. For example, the first opening OP1A may be opened in a way to etch the first capping layer 5A1 by using a mask pattern as an etch barrier. The first opening OP1A of the chip areas 70 may be opened when the first opening OP1 of the scribe lane area 60 is opened.

Next, the source structure 64_1 may be exposed by etching the first capping layer 5A1 formed at the bottom of the first opening OP1A. Accordingly, a first capping pattern 5A1A may remain on the inner wall of the first opening OP1A. The first capping patterns 5A1A of the chip areas 70 may be formed when the first capping pattern 5AA of the scribe lane area 60 is formed.

Figure 12A:
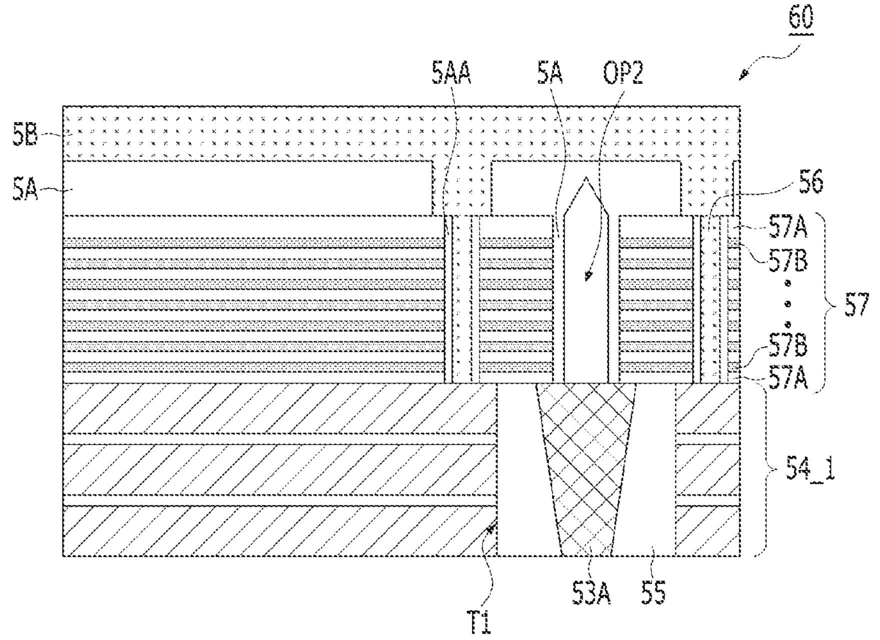

Referring to FIGS. 6 and 12A, a dummy contact plug 56 may be formed in the scribe lane area 60. The dummy contact plug 56 may be formed within the first opening OP1. The dummy contact plug 56 may include an insulating material, such as an oxide. The first capping pattern 5AA that remains within the first opening OP1 may be used as the dummy contact plug 56.

A second capping layer 5B may be formed simultaneously with when the dummy contact plug 56 is formed. The second capping layer 5B may be formed on the dummy stack 57 that is exposed by the first capping layer 5A, and may be formed on the first capping layer 5A.

Figure 12B:
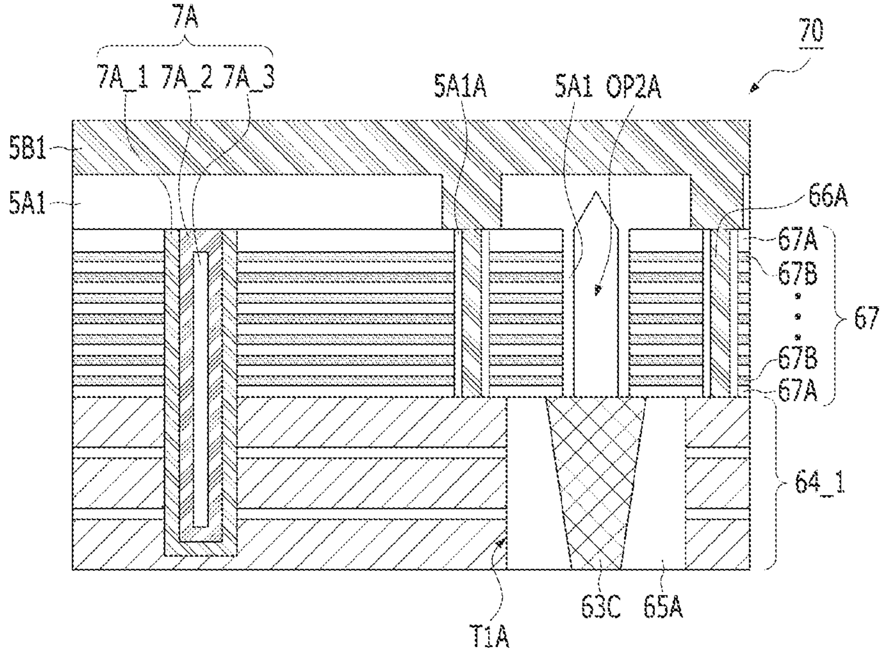

Referring to FIGS. 6, 12A, and 12B, a support 66A may be formed in the chip areas 70. The support 66A of the chip areas 70 may be formed when the dummy contact plug 56 of the scribe lane area 60 is formed. The support 66A may penetrate the cell stack 67, and may be formed on the source structure 64_1. The support 66A may include an insulating material, such as an oxide, a nitride, or an air gap.

A second capping layer 5B1 may be formed simultaneously with when the support 66A is formed. The second capping layer 5B1 may be formed on the source structure 64_1 that is exposed by the first capping layer 5A1, and may be formed on the first capping layer 5A1. The second capping layer 5B1 of the chip areas 70 may be formed when the second capping layer 5B of the scribe lane area 60 is formed.

Figure 13A:
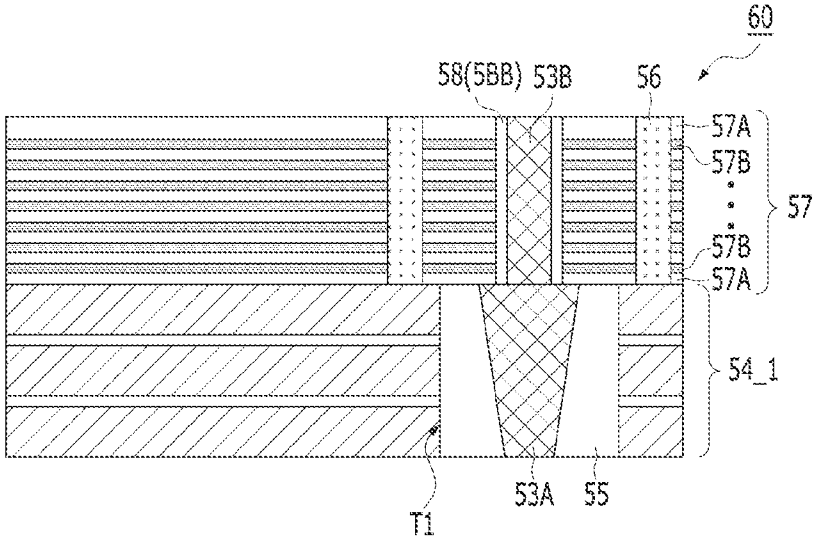

Referring to FIGS. 6 and 13A, a second contact plug 53B may be formed in the scribe lane area 60. First, the second opening OP2 may be selectively opened. For example, the second opening OP2 may be opened in a way to etch the first capping layer 5A and the second capping layer 5B by using a mask pattern as an etch barrier. Next, the first contact plug 53A may be exposed by etching the first capping layer 5A formed at the bottom of the second opening OP2. Accordingly, a second capping pattern 5BB may remain within the second opening OP2. The second capping pattern 5BB that remains within the second opening OP2 may be used as a second spacer 58 for insulating the second contact plug 53B that is formed in a subsequent process.

Next, the second contact plug 53B may be formed within the second opening OP2. The second contact plug 53B may be electrically connected to the first contact plug 53A. The second contact plug 53B may include a conductive material, such as tungsten or metal.

Figure 13B:
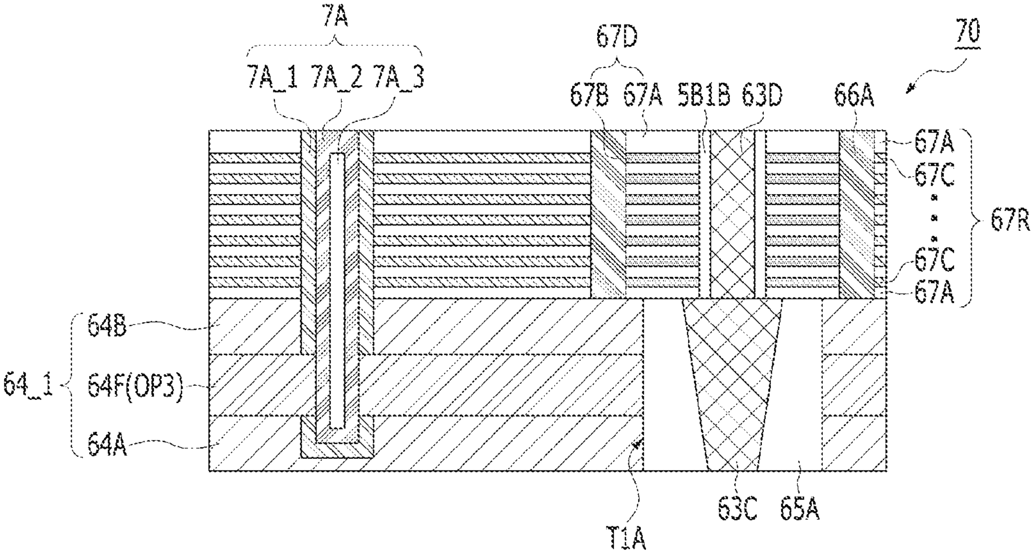

Referring to FIGS. 6, 13A, and 13B, a second contact plug 63D may be formed in the chip areas 70. The second contact plug 63D of the chip areas 70 may be formed when the second contact plug 53B of the scribe lane area 60 is formed. First, the second opening OP2A may be selectively opened. For example, the second opening OP2A may be opened in a way to etch the first capping layer 5A1 and the second capping layer 5B1 by using a mask pattern as an etch barrier.

Next, the first contact plug 63C may be exposed by etching the first capping layer 5A1 formed at the bottom of the second opening OP2A. Accordingly, a second capping pattern 5B1B may remain within the second opening OP2A. The second capping pattern 5B1B of the chip areas 70 may be formed when the second capping pattern 5BB of the scribe lane area 60 is formed.

Next, the source sacrificial layer 64C of the source structure 64_1 of the chip areas 70 may be replaced with a third source layer 64F. First, after a slit (not illustrated) that penetrates the cell stack 67 is formed, a third opening OP3 may be formed by removing the source sacrificial layer 64C through the slit. Next, the channel layer 7A_2 may be exposed by etching the memory layer 7A_1 through the third opening OP3. When the memory layer 7A_1 is etched, the first protection layer 64D and the second protection layer 64E may be etched, and the first source layer 64A and the second source layer 64B may be exposed. Next, the third source layer 64F may be formed within the third opening OP3. The third source layer 64F may be connected to the channel layer 7A_2. The third source layer 64F may include polysilicon.

Next, the second material layers 67B of the cell stack 67 of the chip areas 70 may be replaced with third material layers 67C. The third material layer 67C may be a conductive layer. The third material layer 67C may include a metal material, such as tungsten, or may include a silicide material. Each of the second material layers 67B may be generally replaced with the third material layer 67C or a part thereof may be replaced with the third material layer 67C. A part that belongs to the second material layer 67B and that is close to the slit may be replaced with the third material layer 67C, and a part that belongs to the second material layer 67B and that is spaced apart from the slit may remain. For example, the second material layers 67B on one side of the support 66A may be replaced with the third material layers 67C, and the sacrificial layers 67B on the other side of the support 66A may remain. Accordingly, the cell stack 67 may be divided into a real cell stack 67R and a dummy cell stack 67D. The real cell stack 67R may include the third material layers 67C and first material layers 67A that are alternately stacked. The dummy cell stack 67D may include second material layers 67B and the first material layers 67A that are alternately stacked.

For reference, timing at which the channel structure 7A, the third material layer 67C, or the third source layer 64F is formed may be changed. For example, the channel structure 7A, the third material layer 67C, or the third source layer 64F may be formed before the support 66A is formed, or the channel structure 7A, the third material layer 67C, or the third source layer 64F may be formed after the support 66A is formed.

Referring to FIGS. 6 and 14, an interconnection structure 52 that is electrically connected to the second contact plug 53B may be formed in the scribe lane area 60. The interconnection structure 52 may be formed in the line area 60A or the cross area 60B. The interconnection structure 52 may be formed within an interlayer insulating layer 5C. The interconnection structure 52 may include contact plugs 52D and test lines 52E. The interconnection structure 52 may include a conductive material, such as aluminum, copper, or tungsten. The interlayer insulating layer 5C may include an insulating material, such as an oxide.

For reference, when the interconnection structure 52 is formed, the interconnection structure disposed in the chip areas may be formed. For example, a line, such as a bit line connected to the channel structure, may be formed.

Next, a test pad 59 that is electrically connected to the interconnection structure 52 may be formed in the scribe lane area 60. The test pad 59 may be formed in the line area 60A. The test pad 59 may be electrically connected to the test circuit TC through the interconnection structure 52. For example, the test pad 59 may be electrically connected to the test circuit TC through the interconnection structure 52, the second contact plug 53B, and the first contact plug 53A. The test pad 59, the interconnection structure 52, the second contact plug 53B, the first contact plug 53A, or the test circuit may be included in a test structure T.

Referring to FIGS. 6 and 15, the substrate 100 may be cut along the scribe lane area 60. When the substrate 100 is cut along the scribe lane area 60, the chip areas 70 may be separated from each other.

At this time, as the dummy structures DM formed in the scribe lane area 60 are broken, stress can be prevented from being delivered to the chip areas 70 or the delivery of stress to the chip areas 70 can be reduced or minimized. For example, the first dummy structure may be formed in the cross area 60B, and the second dummy structure may be formed in the line area 60A. As the first dummy structure and the second dummy structure are successively broken when the substrate 100 is cut, stress delivered to the chip areas 70 can be prevented, reduced, or minimized. Accordingly, the chip areas 70 can be protected when the substrate 100 is cut.

If the test structure T is formed in the cross area 60B, stress occurring when the substrate 100 is cut may be concentrated on edges of the chip areas 70, and a slant cut may be caused. Accordingly, by disposing the dummy structure DM in the cross area 60B, the edges of the chip areas 70 can be protected by absorbing stress caused in the cross area 60B. Accordingly, the test structure T may be disposed in the cross area 60B as well as the line area 60A.

According to the aforementioned manufacturing method, the test structure T may be formed in the scribe lane area 60. The degree of integration of semiconductor chips can be increased by disposing the test structure T in the scribe lane area 60, not the chip areas 70. When the test structure T or the dummy structure DM is formed in the scribe lane area 60, the cell structure CS may be formed in the chip areas 70. Accordingly, the test structure T or the dummy structure DM may be formed in the scribe lane area 60 without adding a separate process.

Furthermore, the chip areas 70 can be protected when the substrate 100 is cut by forming the dummy structure DM in the scribe lane area 60. The dummy structure DM of the cross area 60B can absorb stress that occurs when the substrate 100 is cut. Accordingly, although the test structure T is formed in the cross area 60B, damage to edges of the chip areas 70 that occurs when the substrate 100 is cut can be minimized, reduced, or prevented.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and/or change the embodiments in various ways without departing from the technical spirit of the present disclosure written in the claims. Such substitutions, modifications, and/or changes may be said to belong to the scope of the present disclosure.

What is claimed is:

1. A method of manufacturing a semiconductor device, comprising:

forming a test circuit in a cross area of a scribe lane area disposed between chip areas of a substrate;

forming a first dummy structure on the test circuit, wherein the first dummy structure comprises at least one dummy conductive pattern extending in a first direction and in a second direction that intersects the first direction, a dummy stack disposed on the at least one dummy conductive pattern and extending in the same direction as the at least one dummy conductive pattern and including alternately stacked first material layers and second material layers, and a dummy contact plug disposed on the at least one dummy conductive pattern and penetrating the dummy stack in a stacking direction;

forming a first contact plug that penetrates the at least one dummy conductive pattern and that is electrically connected to the test circuit;

forming a second contact plug that penetrates the dummy stack and that is electrically connected to the first contact plug;

forming a test pad in a line area of the scribe lane area of the substrate; and cutting the substrate along the scribe lane area.

2. The method of claim 1, further comprising forming an interconnection structure electrically connected to the test circuit.

3. The method of claim 1, wherein forming the first dummy structure comprises:

forming the at least one dummy conductive pattern over the test circuit;

forming the dummy stack on the at least one dummy conductive pattern; and forming the dummy contact plug that penetrates the dummy stack and that is connected to each of the at least one dummy conductive pattern.

4. The method of claim 3, wherein forming the at least one dummy conductive pattern comprises:

forming a dummy conductive layer and a source layer;

forming the at least one dummy conductive pattern by etching the dummy conductive layer; and forming a source structure by etching the source layer.

5. The method of claim 3, wherein, when forming the at least one dummy conductive pattern, source structures are formed in the chip areas, respectively.

6. The method of claim 5, wherein, when forming the dummy stack, a cell stack is formed in the chip areas.

7. The method of claim 6, wherein, when forming the dummy contact plug, a support that penetrates the cell stack and that is connected to each of the source structures is formed in the chip areas.

8. The method of claim 3, wherein forming the dummy contact plug comprises:

forming a first opening and a second opening that penetrate the dummy stack;

forming a capping layer on the first opening and the second opening;

selectively opening the first opening; and forming the dummy contact plug within the first opening.

9. The method of claim 8, further comprising:

selectively opening the second opening; and forming, within the second opening, a second contact plug electrically connected to the test circuit.

10. The method of claim 1, wherein, when forming the dummy contact plug, the second contact plug is formed.

11. The method of claim 1, wherein cutting the substrate comprises protecting the chip areas as the first dummy structure is broken.

12. The method of claim 1, further comprising forming a second dummy structure in the line area.

13. The method of claim 1, wherein:

the scribe lane area comprises a first area extending in a first direction and a second area extending in a second direction that intersects the first direction, and the cross area is an area in which the first area and the second area intersect.

14. The method of claim 1, wherein the at least one dummy conductive pattern comprises a multi-layer structure.

15. The method of claim 14, wherein the at least one dummy conductive pattern comprises a first dummy conductive pattern, a first protection layer disposed on the first dummy conductive pattern, a second dummy conductive pattern disposed on the first protection layer, a second protection layer disposed on the second dummy conductive pattern, and a third dummy conductive pattern disposed on the second protection layer.

16. The method of claim 15, wherein the first dummy conductive pattern, the second dummy conductive pattern, and the third dummy conductive pattern include polysilicon, and wherein the first protection layer and the second protection layer include oxide.

17. A method of manufacturing a semiconductor device, comprising:

forming a test circuit in a cross area of a scribe lane area disposed between chip areas of a substrate;

forming a dummy conductive layer over the test circuit;

forming at least one dummy conductive pattern by etching the dummy conductive layer;

forming a first contact plug that penetrates the at least one dummy conductive pattern and that is electrically connected to the test circuit;

forming a dummy stack on the dummy conductive pattern by alternately stacking first material layers and second material layers;

forming a dummy contact plug on the dummy conductive pattern, the dummy contact plug penetrating the dummy stack in a stacking direction;

forming a second contact plug that penetrates the dummy stack and that is electrically connected to the first contact plug;

forming a test pad in a line area of the scribe lane area of the substrate; and cutting the substrate along the scribe lane area.

18. The method of claim 17, further comprising:

forming a source layer; and forming at least one source structure by etching the source layer.

19. The method of claim 18, wherein, when forming the at least one dummy conductive pattern, the at least one source structure is formed in the chip areas.

20. The method of claim 17, wherein, when forming the dummy contact plug, the second contact plug is formed.

* * * * *